US006084538A

United States Patent [19]
Kostelnik et al.

[11] Patent Number: 6,084,538
[45] Date of Patent: Jul. 4, 2000

[54] OFFSET CALIBRATION OF A FLASH ADC ARRAY

[75] Inventors: Matthew M. Kostelnik, Arvada, Colo.; Russell Croman; Marius Goldenberg, both of Austin, Tex.

[73] Assignee: Cirrus Logic, Inc., Fremont, Calif.

[21] Appl. No.: 09/095,162

[22] Filed: Jun. 10, 1998

Related U.S. Application Data

[63] Continuation-in-part of application No. 08/927,122, Sep. 5, 1997, Pat. No. 5,990,707, and a continuation-in-part of application No. 08/924,108, Sep. 5, 1997, Pat. No. 5,990,814.

[51] Int. Cl.[7] .............................. H03M 1/10; H03M 1/06
[52] U.S. Cl. .......................................... 341/120; 341/118
[58] Field of Search ...................... 327/307, 64; 341/118, 341/120 OR, 159

[56] References Cited

U.S. PATENT DOCUMENTS

| | | |
|---|---|---|
| 4,408,349 | 10/1983 | Yukawa . |
| 4,804,863 | 2/1989 | Welland et al. ........................ 307/227 |
| 4,864,437 | 9/1989 | Couse et al. . |
| 4,979,055 | 12/1990 | Squires et al. . |
| 5,170,299 | 12/1992 | Moon . |
| 5,255,136 | 10/1993 | Machado et al. . |
| 5,297,184 | 3/1994 | Behrens et al. . |
| 5,321,559 | 6/1994 | Nguyen et al. . |
| 5,335,365 | 8/1994 | Ballantyne et al. . |
| 5,345,342 | 9/1994 | Abbott et al. . |
| 5,384,671 | 1/1995 | Fisher . |
| 5,422,760 | 6/1995 | Abbott et al. . |
| 5,424,881 | 6/1995 | Behrens et al. . |
| 5,459,679 | 10/1995 | Ziperovich . |
| 5,572,558 | 11/1996 | Beherns . |
| 5,576,904 | 11/1996 | Behrens ................................. 360/51 |
| 5,638,230 | 6/1997 | Kadlec ................................. 360/78.04 |
| 5,642,243 | 6/1997 | Bliss ........................................ 360/51 |

OTHER PUBLICATIONS

Cideciyan et al., "A PRML System for Digital Magnetic Recording," *IEEE J. on Sel. Com.*, 10, Jan. 1992.

Coker et al., "Implementation of PRML in a Rigid Disk Drive," *IBM Storage Systems Products Division*, Manuscript received Jul. 7, 1991.

Fields et al., "SA 19.1: A 200Mb/s CMOS EPRML Channel with Integrated Servo Demodulator for Magnetic Hard Disks," *IEEE Int'l Solid–State Circuits Conf*, Feb. 8, 1997.

Goodenough, "DSP Technique Nearly Doubles Disk Capacity," *Electronic Design*, 53–57, Feb. 4, 1993.

Reed et al., "Performance of A d=0 Demod/Remod Detector With Partial Erasure Matching," *Cirrus Logic*, Manuscript received Feb. 4, 1997.

Spalding et al., "SA 19.5: A 200 Msample/s 6b Flash ADC in 0.6μm CMOS," *IEEE International Solid–State Circuits Conference*, Feb. 10, 1996.

(List continued on next page.)

*Primary Examiner*—Brian Young
*Assistant Examiner*—Patrick Wamsley
*Attorney, Agent, or Firm*—Richard D. Egan; Dan Shifrin

[57] ABSTRACT

A system and method is disclosed for calibrating comparators of an ADC. Individual comparators may be calibrated at random or psuedo-random times while the ADC is performing conversions without the addition of extra "proxy" or replacement comparators. More particularly, at periodic intervals a psuedo-random one of the comparators may be disconnected from the standard ADC circuitry for calibration. In order to prevent a significant degradation in the conversion quality, the digital logic downstream of the comparators may be designed to provide the necessary adjustments to accommodate for the removal of one of the comparators. Thus, a calibration technique is provided in which individual comparators are removed from the data conversion path during conversion and the downstream logic adjusts to accommodate for the removal of the comparator. The calibration technique is particularly advantageous for use with optical data storage systems.

61 Claims, 21 Drawing Sheets

OTHER PUBLICATIONS

Spurbeck et al., "Interpolated Timing Recovery for Hard Disk Drive Read Channels," *IEEE*, Aug. 1997.

Tuttle et al., "TP 4.2: A 130Mb/s PRML Read/Write Channel with Digital–Servo Detection," IEEE International Solid–State Circuits Conference, Feb. 8, 1996.

Vanderkooy et al., "Resolution Below the Least Significant Bit in Digital Systems with Dither," *J. Audio Eng. Soc.*, 32(3), Mar. 1984.

Welland et al., "FA 17.1: A Digtial Read/Write Channel with EEPR4 Detection," *IEEE International Solid–State Circuits Conference*, Feb. 18, 1994.

Welland et al., "Implementation of a Digital Read/Write Channel with EEPR4 Detection," *IEEE Transactions, Magnetics*; 31(2), Mar. 1995.

Welland et al., "Implementation of a Digital Read/Write Channel with EEPR4 Detection,"—Outline; Crystal Semiconductor Corporation and Cirrus Logic; TMRC '94 Session:F2.

Yamasaki et al., SA 19.2: A 1,7 Code EEPR4 Read Channel IC with an Analog Noise Whitened Detector, *IEEE International Solid–State Circuits Conference*, Feb. 8, 1997.

Dyer et al., FA 9.3; "Analog Background Calibration of a 10b 40Msample/s Parallel Pipelined ADC," *IEEE International Solid–State Circuits Conference*, 1998.

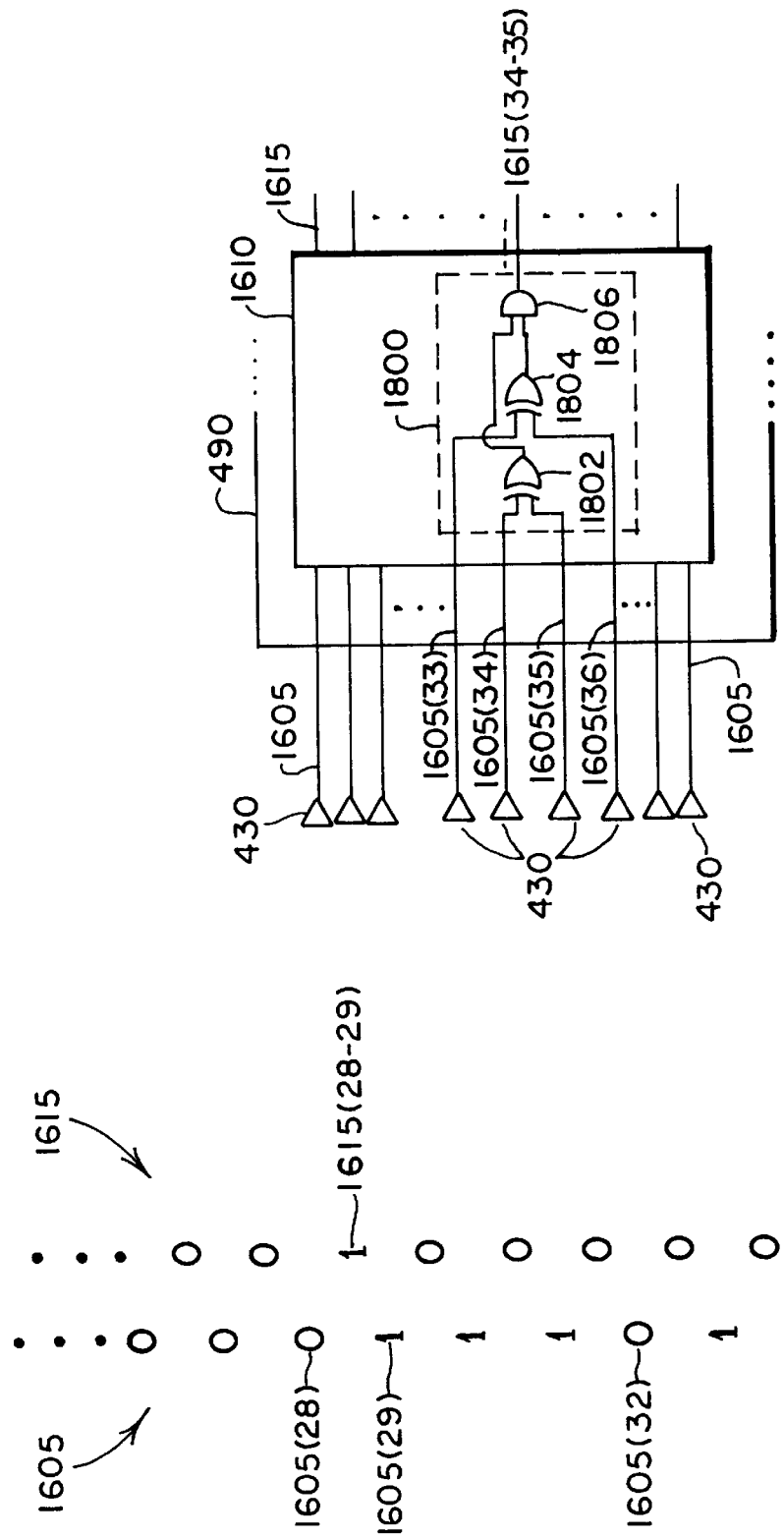

OFFSET CALIBRATION OF A FLASH ADC ARRAY

This application is a continuation-in-part of U.S. patent applications Ser. No. 08/927,122, now U.S. Pat. No. 5,990,707, filed Sep. 5, 1997 and Ser. No. 08/924,108, now U.S. Pat. No. 5,990,814 filed Sep. 5, 1997.

BACKGROUND OF THE INVENTION

1. Field of the Invention

The present invention relates to the offset calibration, and more particularly to offset calibration in flash analog to digital converters utilized in data storage systems such as, for example, optical disks data storage systems using data channel circuits.

2. Description of Related Art

In many data detection circuits an electrical signal is received from a data storage media, such as a CD-ROM, DVD, or other optical disk, magnetic hard disk, magnetic tape etc. In the case of optical disks, the electrical signal is generated from light that is reflected off an optical disk and converted to electrical pulses. The electrical pulses may then be transmitted to a data detection circuit for further signal processing to recover the data in a useable form. Data detection circuits may also be combined with circuitry for write operations. For example, circuitry for both read and write operations may be combined read/write channel circuits utilized with magnetic hard disks. In contrast, some optical disks are utilized in read only systems and thus the data detection circuit need not be combined with write circuitry. In general both read only and read/write data detection circuits may also include servo circuitry.

Decoding the pulses into a digital sequence can be performed by a simple peak detector in an analog read channel or, as in more recent designs, by using a discrete time sequence detector in a sampled amplitude read channel. Discrete time sequence detectors are preferred over simple analog pulse detectors because they compensate for intersymbol interferences (ISI) and, therefore, can recover pulses recorded at high densities. As a result, discrete time sequence detectors increase the capacity and reliability of the storage system.

There are several well known discrete time sequence detection methods for use in a sampled amplitude read/write channel circuit including discrete time pulse detection (DPD), partial response (PR) with Viterbi detection, partial response maximum likelihood (PRML) sequence detection, decision-feedback equalization (DFE), enhanced decision-feedback equalization (EDFE), and fixed-delay tree-search with decision-feedback (FDTS/DF). When discrete methods are utilized for sampled amplitude read channel systems, an analog to digital converter (ADC) is typically utilized to convert the high frequency data which is contained on disk.

One type of ADC which may be utilized to convert high frequency disk data is a flash ADC. Such an ADC may contain multiple comparators for conversion of the analog data to digital data. In order to accurately convert the high frequency analog data, it is desirable that the comparators exhibit very little electrical variation from ideal operation even in the presence of "offsets". Many sources exist for offsets including mismatch between two devices (for example transistors, resistors, capacitors, etc.) which though intended to be identical, vary to one degree or another due to limitations of fabrication processes.

One approach to compensate for such offsets is to utilize a DC auto-zero operation. FIG. 1 illustrates an example of an auto-zero operation for use with an amplifier of a flash ADC comparator. As shown in FIG. 1, a comparator having input voltages $V_{in1}$ and $V_{in2}$, differential transistors $M_1$ and $M_2$, and outputs $V_{o1}$ and $V_{o2}$ are provided. In normal operation, switches $S_1$ and $S_2$ are connected to $V_{in1}$ and $V_{in2}$ respectively and switches $S_3$ and $S_4$ are open. For auto-zero operation, the switches $S_1$ and $S_2$ are connected to $V_{ref1}$ and $V_{ref2}$ respectively and switches $S_3$ and $S_4$ are closed. Control of the switches in this manner during auto-zero operation will bias the capacitive nodes $V_{o1}$ and $V_{o2}$ with the effect that the amplifier stage is biased such the output voltage ($V_{o1}$-$V_{o2}$) is substantially zero with an input voltage differential of $V_{ref1}$-$V_{ref2}$.

Auto-zero schemes such as described above have disadvantages in that only DC (or static) mismatches are accounted for and dynamic mismatches (from, for example, different parasitic capacitances, differential charge injection from the switches, etc.) are not corrected. Thus, during actual operation of the amplifier (as opposed to a DC auto-zero situation where the inputs are not changing) offsets will still result. Moreover the auto-zero scheme described above does not address the use of comparators having multiple amplifier stages as the DC offset of the first stage may be accounted for, but the offsets of subsequent stages are not corrected.

It is desirable to auto-zero and calibrate the comparators of a flash ADC in a manner so as not to impact the information that the ADC is converting. In magnetic data storage systems, such as magnetic hard disks, auto-zero and calibration operations may occur when the data channel is not in use. For example, magnetic media is generally written in concentric circles divided into sectors on a disk. Servo information is time multiplexed with user data. This allows time periods to take the user data channel or the servo channel off line to perform an auto-zero or calibration operation. In optical storage systems, however, the data is generally stored in a continuous spiral on the disk without a sector break with both user data and servo data frequency mutliplexed within the continuous data stream. Thus, in optical systems the data channel may be in continuous use for long periods of time without a break. In such cases, the ADC generally can not be disabled for auto-zero and calibration operations without disrupting the data stream. In order to provide for periodic calibrations of the ADC comparators, extra (or proxy or replacement) comparators may be provided via a multiplexing scheme such that if N comparators are to be utilized for the data conversion, the ADC will include at least N+1 comparators. Thus, when one comparator is being calibrated another comparator may be multiplexed into the ADC conversion path so that N comparators are still utilized. However, such multiplexing schemes undesirably provide additional circuit complexity and disrupt the comparator array.

SUMMARY OF THE INVENTION

A system and method is disclosed for calibrating comparators of an ADC. Individual comparators may be calibrated at random or psuedo-random times while the ADC is performing conversions without the addition of extra "proxy" comparators. More particularly, at periodic intervals a psuedo-random one of the comparators may be disconnected or decoupled from the standard ADC circuitry for calibration. In order to prevent a significant degradation in the conversion quality, the digital logic downstream of the comparators may be designed to provide the necessary adjustments to accommodate for the removal of one of the comparators. Thus, a calibration technique is provided in which individual comparators are removed from the data conversion path during conversion and the downstream logic adjusts to accommodate for the removal of the comparator. The calibration technique is particularly advantageous for use with optical data storage systems in which continuous data conversion is necessary without interruption for calibration purposes.

In one embodiment, a method of calibrating an analog to digital converter is provided. The method may include providing a plurality of comparators, outputs of the comparators being coupled to logic circuitry, the comparators used when performing analog to digital conversions. Further, the method may include electrically decoupling an output of at least one of the comparators from the logic circuitry without providing a replacement output for the decoupled output and calibrating the at least one comparator while the at least one comparator is electrically decoupled. Finally, the method may include continuing to perform analog to digital conversions during the calibration.

In another embodiment, a method of operating a flash analog to digital converter in a data channel circuit is provided. The method may include performing analog to digital conversions by utilizing a plurality of comparators and removing at least one of the plurality of comparators from a data conversion path. The one comparator removed may be calibrated when the comparator is removed from the data conversion path. Further, the method may include continuing to perform analog to digital conversions during the calibrating step, fewer comparators being utilized for data conversions during the calibrating step than utilized during data conversions performed when calibration is not occurring.

Also disclosed herein is an analog to digital converter for performing analog to digital conversions. The converter may include a plurality of comparator circuits, each having a plurality of inputs and at least one output, together the outputs of the plurality of comparator circuits providing a transition from a first digital state to a second digital state indicative of an analog input coupled to inputs of the plurality of comparator circuits. The converter may also include an electrical circuit coupled to at least one output of each of the plurality of comparator circuits, the outputs of the comparator circuits being selectably coupled to outputs of the electrical circuit to allow calibration of at least one of the comparators while analog to digital conversions are being performed by the analog to digital converter. The electrical circuit may be configured to allow the output of the at least one comparator being calibrated to be decoupled from the output of the electrical circuit. Further, the converter may be configured so that each of the plurality of comparator circuits may be coupled to at least one output of the electrical circuit during standard analog to digital conversions. Thus, each comparator is utilized during standard analog to digital conversions. In addition, at least one of the plurality of comparator circuits may be disconnected or decoupled from an output of the electrical circuit during calibration of the comparator such that fewer comparators may be utilized during analog to digital conversions performed during calibration compared to standard analog to digital conversions.

In yet another embodiment, a data storage system is provided. The system may include a data input coupled to a data storage medium, the input receiving a data stream from the data storage medium. Also included within the system may be an analog to digital converter coupled to the input and a plurality of comparators within the analog to digital converter. Further, an electrical circuit may be coupled to a plurality of comparator outputs, the electrical circuit configured so that the output of at least one comparator circuit being calibrated may be disconnected from a data conversion path to allow calibration of the at least one comparator circuit while the analog to digital converter is performing data conversions.

Further disclosed herein is a method of operating an optical data storage system. The method may include receiving an input data signal from an optical data storage medium and coupling the input data signal to a sampling circuit, the sampling circuit including a plurality of comparators. The method may also include utilizing the plurality of comparators when performing analog to digital conversions and removing at least one of the plurality of comparators from a data conversion path. In addition, the method may include calibrating the at least one comparator when the at least one comparator is removed from the data conversion path, and continuing to perform analog to digital conversions during the calibrating step, fewer comparators being utilized during the calibrating step for data conversions than utilized during the performing step.

In another embodiment, a method of calibrating an analog to digital converter is provided. The method may include providing a plurality of comparators and utilizing a first set of the comparators for analog to digital conversions performed when a calibration is not occurring. The method further includes calibrating at least one of the comparators while analog to digital conversions are being performed and utilizing a second set of the comparators during analog to digital conversions performed during the calibrating step. Moreover fewer comparators may be utilized for analog to digital conversions performed during the calibrating step than utilized during analog to digital conversions performed when a calibration is not occurring.

In yet another embodiment, a method of calibrating an analog to digital converter is provided. The method includes generating a plurality of comparator output values from at least one comparator, providing the comparator output values to electrical circuitry to calculate a digital value based upon the plurality of comparator output values, and calibrating the at least one comparator. Further, the method includes decoupling from at least a portion of the electrical circuitry the comparator output value generated by the at least one comparator being calibrated without providing a replacement comparator output value for the decoupled comparator output value.

The present invention also includes an analog to digital converter having at least one comparator, the at least one comparator having an output coupled to a circuit to determine a digital value based upon data at the output and decoupling circuitry coupled to the output. The decoupling circuitry allows the output of the at least one comparator to be decoupled from at least a portion of the circuit and allows calibration of the at least one comparator during conversion without the use of a replacement comparator.

BRIEF DESCRIPTION OF THE DRAWINGS

It is to be noted that the appended drawings illustrate only particular embodiments of the invention and are, therefore, not to be considered limiting of its scope, for the invention may admit to other effective embodiments.

FIGS. 16, 16A, 16B, 16C, and 16D illustrate bubble suppression techniques.

FIG. 17 illustrates a circuit for use in a bubble suppression circuit.

DETAILED DESCRIPTION OF THE INVENTION

Figure 2:
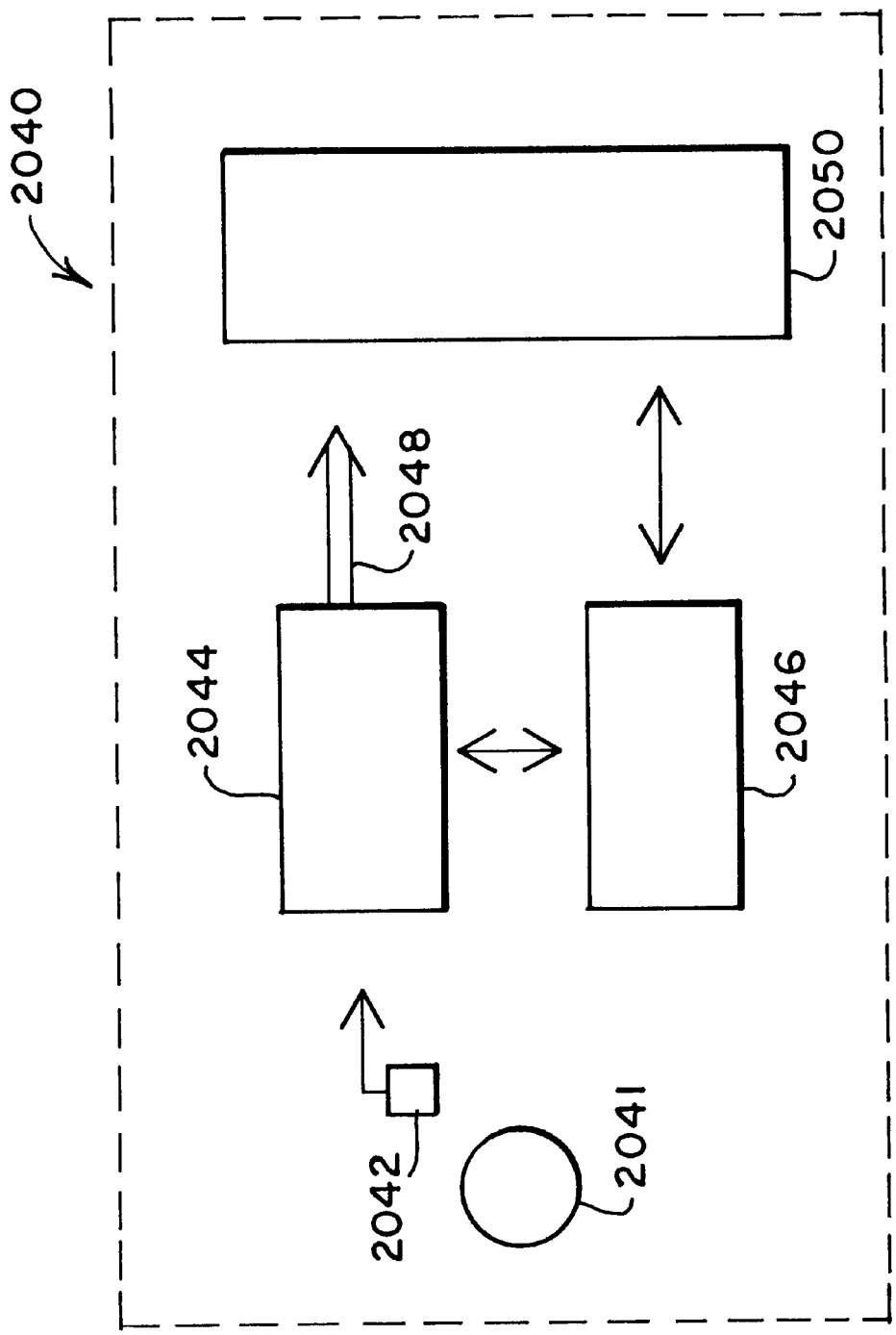
FIG. 2 is a block diagram of an optical disk data storage system.

FIG. 2 illustrates a data storage system 2040 in which the present invention may be utilized. The data storage system may include a disk 2041 and a read head 2042. In one embodiment, the disk 2041 may be an optical disk such as a CD-ROM or a DVD disk and the read head 2042 may be an optical pickup such as holographic or astigmatic heads which utilize photodiode arrays to convert optical signals to electrical signals. Coupled to the read head 2042 is a data detection circuit 2044. As shown, a data detection circuit may include read circuitry, servo circuitry, and other circuitry. In the case of an optical storage system, the data detection circuit 2044 may be a DVD or CD-ROM DSP (Digital Signal Processor) and decoder circuit compatible with industry interface standards such as the standard IDE/ATA interface and more specifically the ATAPI (AT Attachment Packet Interface) interface. A local microcontroller 2046 may be coupled to the data detection circuit 2044. The microcontroller 2046 and the data detection circuit 2044 may also be coupled to a host computer 2050. The data detection circuit 2044 may be coupled to the host computer through a portion of the host computer's ATA bus 2048. The optical disk, pickup head, microcontroller, and host computer may be any of a wide variety of commercially available components. Though the data storage system shown in the illustrative embodiment of FIG. 2 is coupled to a host computer, it will be recognized that a data storage system may not require a host computer, such as for example, DVD player systems.

The data storage system 2040 shown in FIG. 2 is just one illustrative example of a data storage system. Other data storage systems may also utilize the present invention. For example, magnetic disk drive systems utilizing a read channel circuit as a data detection circuit may also utilize the present invention. Further, though shown separately, various components of the data storage system may be combined or additional components may be considered to be part of the system including components such as RAM, ROM, power supply circuits, servo circuitry, and other circuits. In addition, though shown as separate from the host computer, the data storage system may be integrally formed within a computer or alternatively, the data storage system 2040 may be formed as a stand alone unit independent of a host computer. Moreover, certain features of the present invention are not limited to the use of data storage systems and may be utilized in many other electronic circuits.

Figure 3:
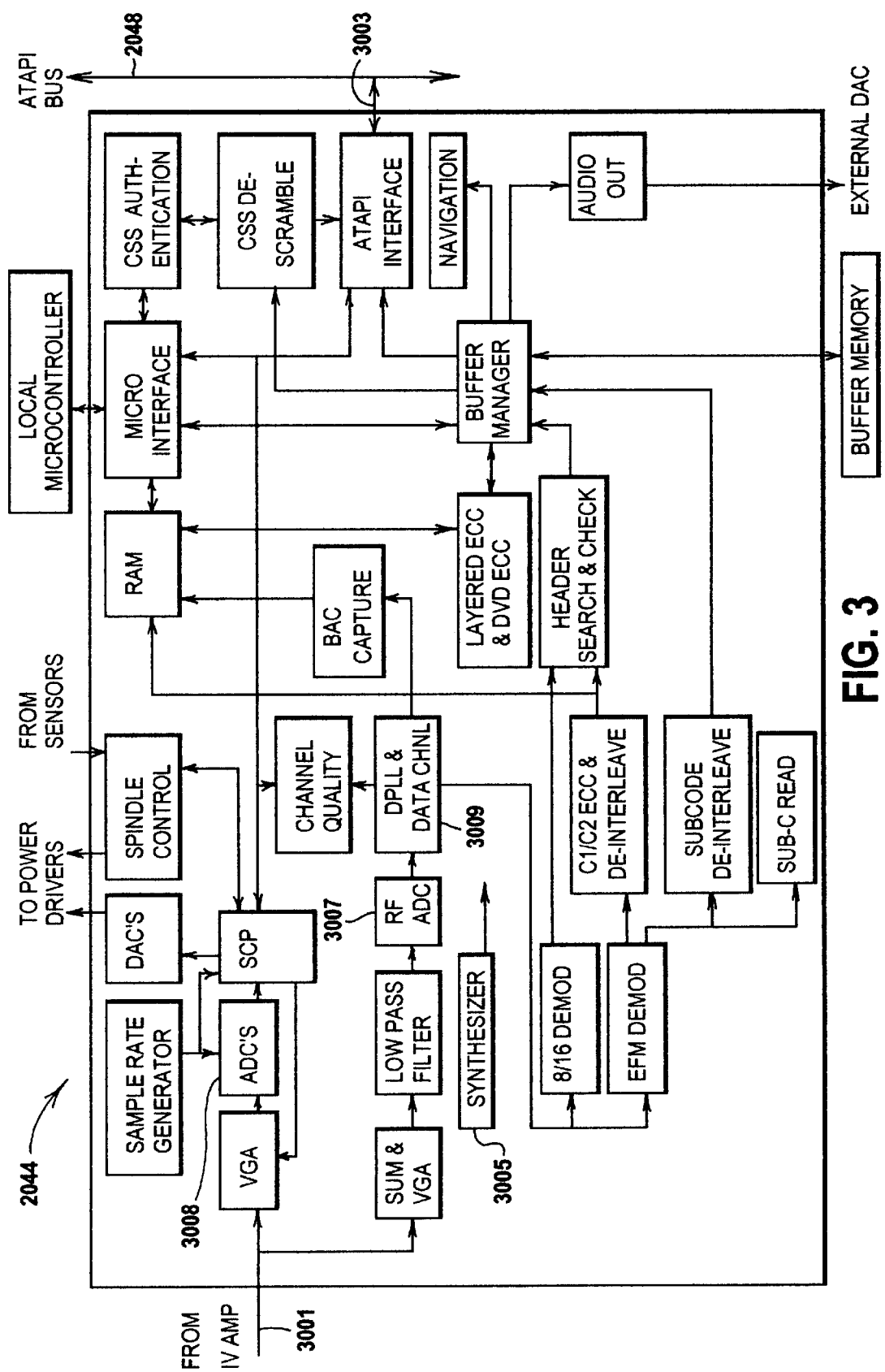
FIG. 3 is a block diagram of a data detection controller circuit.

FIG. 3 shows one exemplary embodiment of a data detection circuit 2044. As shown in FIG. 3, the data detection circuit 2044 may include a data input 3001 which may be coupled to an optical pickup head and may include a data output 3003 which may be coupled to an ATAPI bus 2048. The data detection circuit 2044 may also include a frequency synthesizer 3005 which may provide clock signals to the various circuit elements such as the read path ADC 3007, the servo path, data channel circuitry 3009, the servo path ADCs 3008, and the other circuitry shown in FIG. 3 which may include various data recovery circuits such as decimation filters, equalizer circuits, offset and gain control circuits, decoder circuits, digital PLL circuits, etc. Though FIGS. 2 and 3 illustrate an example data detection circuit 2044 which has read operations only, the present invention may be utilized in a circuit that also includes write circuitry (i.e. a read/write data channel circuit). Thus, as used herein a data channel circuit may indicate a read channel only circuit or a circuit that includes read and write functions (read/write channel circuit) or additional functions It will also be recognized that the ADC's and calibration techniques disclosed herein may be utilized with a wide range of circuits.

Figure 4:
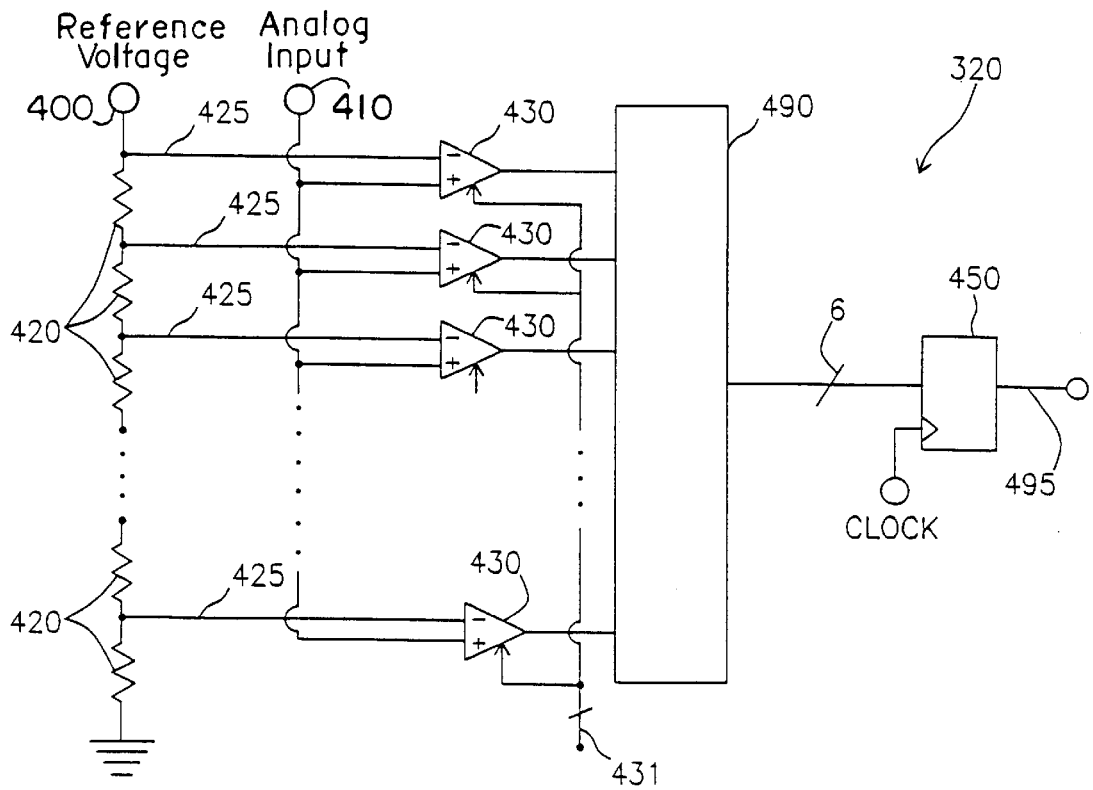
FIGS. 4 and 4A are block diagrams of a flash ADC.

The ADC's 3008 and 3007 may be designed in a number of manners. For example, the ADC 3007 may be a six bit flash ADC. An exemplary six bit flash ADC 320 is shown in FIG. 4. The ADC 320 of the embodiment of FIG. 4 may include an analog input 410 and a reference voltage input 400. The reference voltage is then divided into separate voltages through a series of resistors 420 which form a resistor voltage divider. Output taps are then provided from the resistor voltage divider to provide reference voltage inputs 425 to a series of comparators 430. In one embodiment, sixty-three separate voltages may be provided through sixty-three resistors 420 (each voltage varying by 1/64 of the reference voltage from the adjacent resistor) to sixty-three comparators 430. The analog input which is to be converted to a digital value is provided through input 410 to each of the comparators 430. Each comparator receives control signals as shown by control bus line 431. The control signal may include a clock signal operating at the system read operation clock speed (for example typically between 50 and 350 MHz) and other control signals such as those shown in FIGS. 11 and 12. The output of each comparator is a digital value which indicates whether the analog input 410 is greater than or less than the voltage on the reference voltage input 425 that is coupled to the comparator. The outputs of the comparators 430 are then provided to digital logic 490. By observing where the outputs of the comparators 430 change from one digital state to the other, the digital logic 490 determines which two reference voltages that the analog input lies between and provides a 6-bit digital representation of a voltage that represents, for example, the lower or higher reference voltage or a midpoint voltage. This 6-bit output may then be provided at output 495 through clocked D flip-flops 450.

Figure 4A:
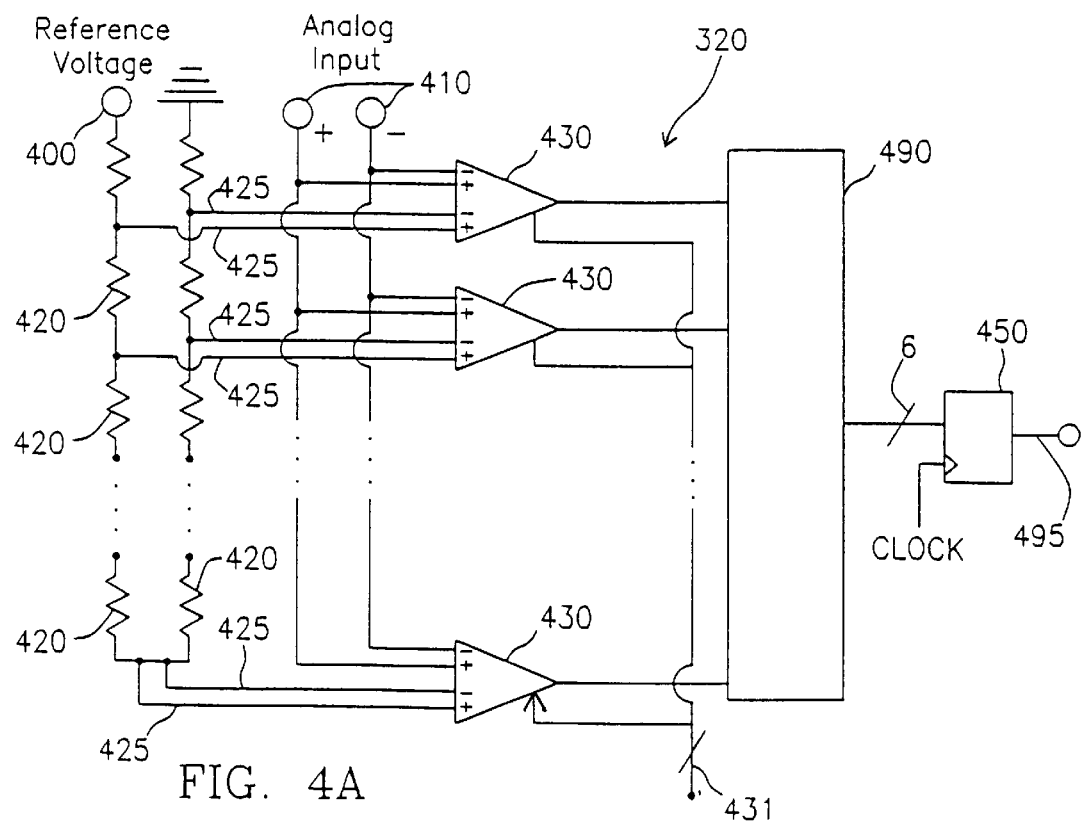

Though the input voltages and reference voltages to the comparators of FIG. 4 are shown as single ended, it will be recognized that differential inputs and reference voltages may be utilized. For example, FIG. 4A illustrates a differential input version of the ADC of FIG. 4. As shown in FIG. 4A, differential inputs are provided for the reference voltage inputs 425 and the analog inputs 410. The reference voltage inputs 425 may be generated from a folded string of resistors 420 as shown. It will also be recognized that the present invention may be utilized with other ADC circuits and other comparator circuits in addition to those disclosed herein.

Sliced Integration

Figure 6:
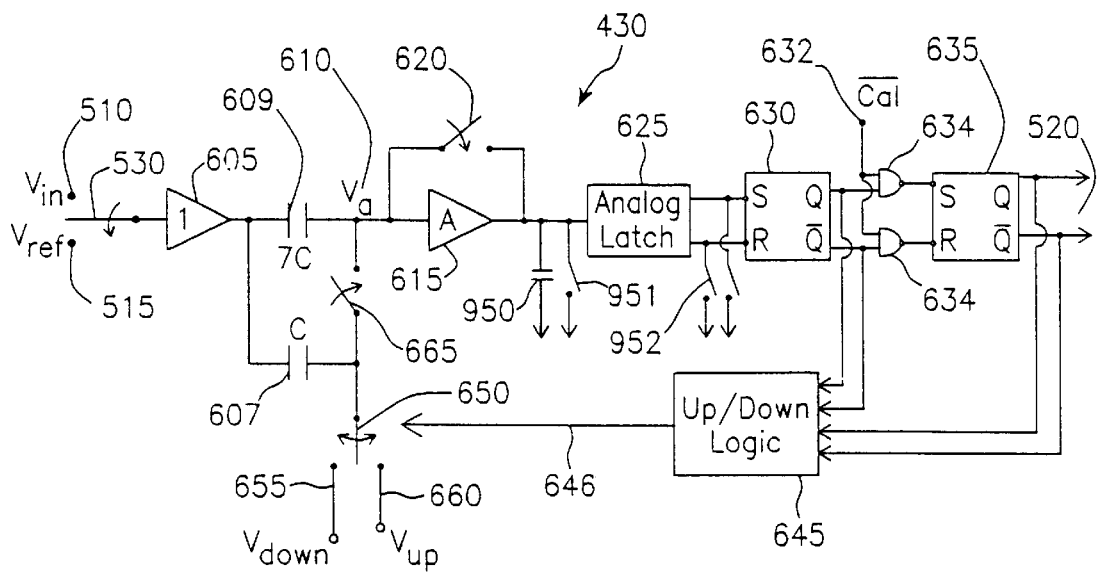
FIG. 6 is a more detailed circuit diagram of the circuit of FIG. 5.
Figure 9:
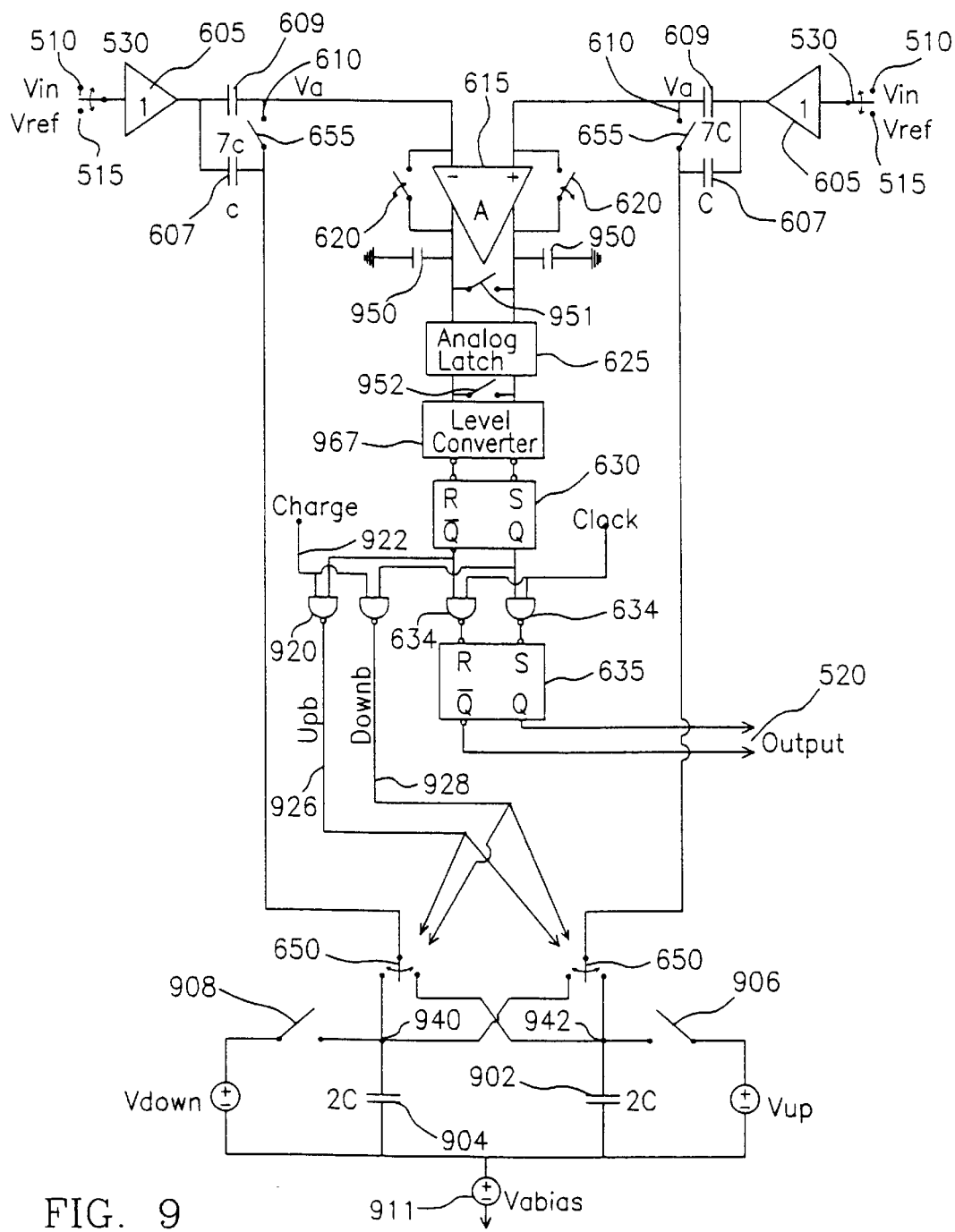
FIG. 9 is one embodiment of a circuit for implementing the calibration techniques disclosed herein.

A circuit for implementing a comparator 430 is shown in FIG. 9. An alternative circuit for implementing the comparator 430 is shown in FIG. 6 as a single ended circuit for conceptual purposes. The circuits of FIGS. 9 and 6 both utilize the same comparison techniques, however, the circuits illustrate alternative calibration techniques as discussed below. As shown in FIG. 9, $V_{in}$ inputs 510 and $V_{ref}$ inputs 515 are selectively connected to the comparator through the input switches 530 for providing the input signal to be converted and reference voltages respectively. The switches 530 are connected to buffer amplifiers 605 which each have an output connected to two capacitors 607 and 609. The capacitors 609 are also connected to voltage nodes 610 ($V_a$). Thus, the comparator input is AC coupled to voltage nodes 610 ($V_a$). The capacitors 607 have a capacitance value of C while the capacitors 609 have a capacitance value seven times the value of C. The buffer amplifiers 605 serve to isolate the ADC comparators 430 from each other so that loading effects between comparators and other interactions are minimized (particularly while performing the calibration operations discussed below). The voltage nodes 610 are provided as inputs to an integrating amplifier 615 which has a transconductance of $g_m$. A capacitor 950 is shown connected to each output of the integrating amplifier 615. Though shown for conceptual purposes as discrete capacitors, as will be discussed in more detail below the capacitors 950 need not be capacitor separate from the amplifier, but rather may result from the parasitic capacitances of a variety of the amplifier transistors. Switches 951, which are controlled by an AMP signal, may be considered part of the amplifier 615. Switch 952 is controlled by an inverse of the LATCH signal, the LATCHB signal. Switch 952 and the level converter may be considered part of the analog latch as shown in more detail in FIG. 9A (for example, transistors 844, 842, 858, and 852 of FIG. 9A).

Switches 620 operate as reset switches and are closed as shown by the arrow during the auto-zero sequence. The switches 620 are reopened when the auto-zero operation is completed. The output of integrating amplifier 615 is provided to an analog latch 625 which provides an output to a digital latch 630. The output of the digital latch 630 is provided through NAND gates 634 to a second digital latch 635. The outputs of the second digital latch 635 provide the outputs 520 of the entire comparator structure. These outputs 520 may then be provided to encoding logic 490 such as shown in FIG. 4. The circuits and structures of the calibration loop from the outputs of the latch 630 to the control nodes 610 are discussed in more detail below.

Figure 1:
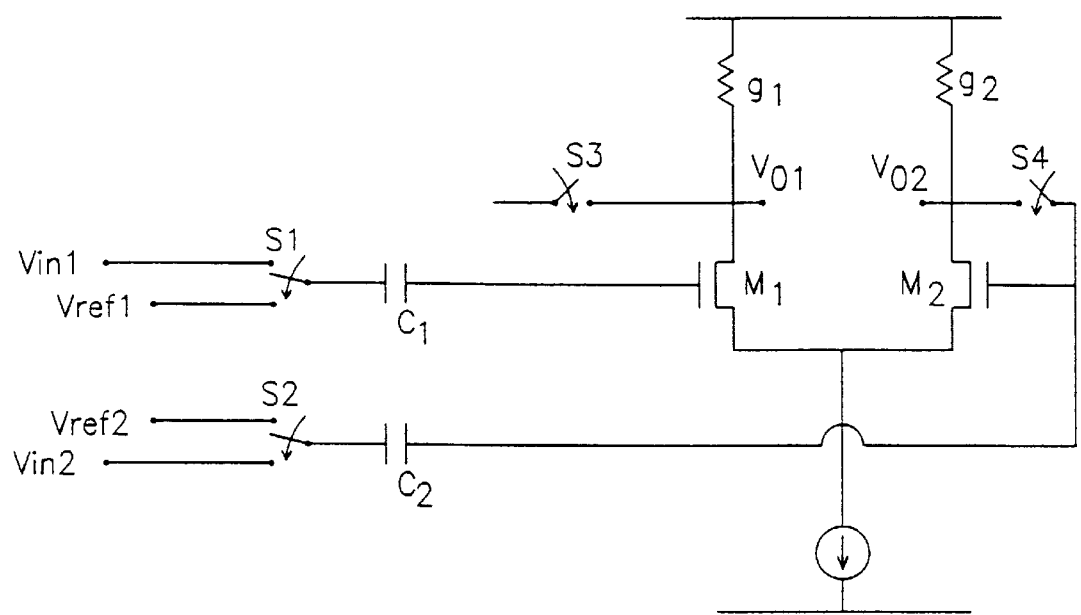
FIG. 1 illustrates a prior art circuit for implementing ADC auto-zero techniques

The comparison operations of the circuit of FIG. 9 will be discussed with reference to the circuit when the circuit is operating in a comparison operation mode rather than a calibration mode. Initially the reference voltages $V_{ref}$ 515 are connected to the circuit through switches 530 while auto-zero switch 620 is closed as described in more detail below (with reference to calibration). Prior to beginning the comparison mode, the auto-zero switch 620 is then opened again. This initial connection of the reference voltages generates a voltage of $V_{ref}$ on the capacitors 609 which remains present when the comparator input is changed to the $V_{in}$ signal source. Thus, when comparisons are being performed the capacitors 609 may be considered to be floating constant voltage sources. This series connection of voltage sources generates the input voltages at node 610 ($V_a$) for the integrating amplifier 615. The $V_{in}$ input signals 510, which are the ADC input signal, represents the signal applied at the non-inverting input of the comparator. There is no inverting input to this comparator. By construction, this comparator will compare its input voltage to 0. The floating constant voltage sources, the capacitors 609, shift the voltage threshold of the comparator from 0. In this way, instead of comparing the input signal to 0, the comparator is comparing the input signal to the voltage $V_{ref}$. This effectively achieves the result of the typical comparator (FIG. 1) which has the input signal connected at the non-inverting input and the reference voltage connected at the inverting input.

It should be noted that there is not a track-and-hold operation performed at the input to the integrating amplifier of FIG. 9. After the $V_{ref}$ voltage is transferred to the capacitors, the input signal is continuously connected at the input of the integrating amplifier and is allowed to swing freely during the comparison operation. This is in contrast with the classical implementation of a comparator which relies on the fact that the input signal remains constant for the entire duration of the comparison in order to achieve an accurate decision.

Figure 9A:
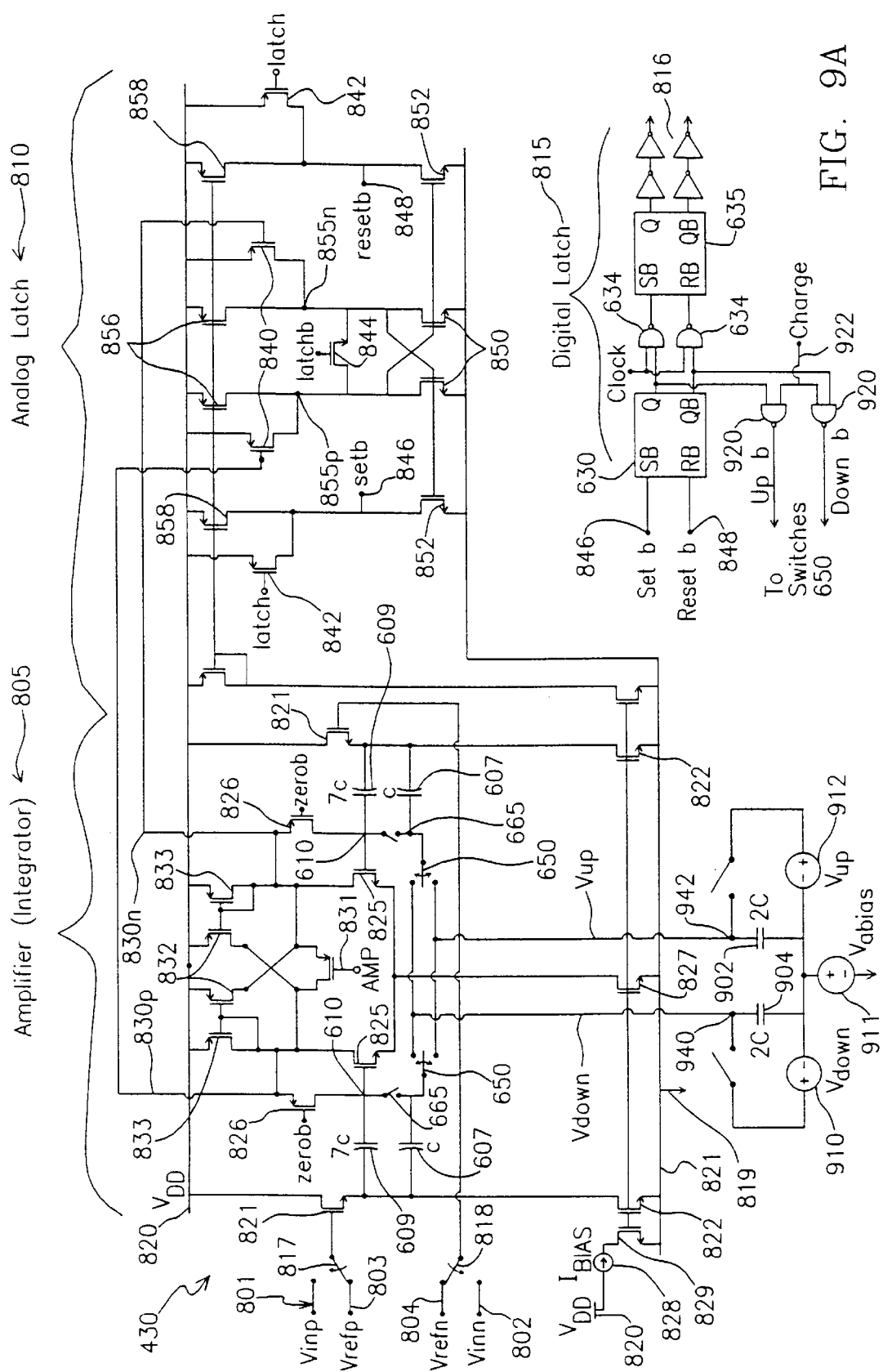
FIG. 9A is another exemplary circuit for accomplishing the ADC calibration techniques according to the present invention.

One preferred embodiment for use as the comparator 430 is shown in FIG. 9A. As shown in FIG. 9A, the comparator 430 may include three circuit blocks, such as an integrating amplifier 805, an analog latch 810, and a digital latch 815. The inputs to the comparator 430 may be differential inputs, such as analog voltage inputs $V_{inp}$ 801 and $V_{inn}$ 802 and the reference voltage input $V_{refp}$ 803 and $V_{refn}$ 804. Input switches 817 and 818 are provided for selecting which of the inputs are connected to the comparator 430. The comparator also has an output 816 which may be provided to digital encoding logic, such as digital logic 490 of FIG. 4.

The signals at the inputs of the comparator 430 are first provided to the integrating amplifier 805. The integrating amplifier or 805 is of symmetrical design for the side of the integrating amplifier with like reference numbers utilized in FIG. 9A for each symmetrical circuit element. The inputs to the integrating amplifier 805 are first provided to a pair of input transistors 821. The input transistors 821 perform the buffer function of amplifier 605 of FIG. 9. The input transistors 821 are connected between $V_{DD}$ 820 and transistors 822. Transistors 822 are also connected to ground 819. The input transistors 821 are also AC coupled to integrating amplifier differential transistor pair 825 through capacitors 609. Capacitors 609 may have a capacitance value of 7C as shown in FIG. 9A. In one preferred embodiment, the value of 8C may be 0.300 pF (300 fF). The capacitors shown herein may be formed from n-channel transistors connected as a capacitor. As described below, pump switch 665 is selectively opened or closed to isolate and connect capacitors 609 and 607 and switch 650 is selectively applied to the voltage up input 660 or the voltage down input 655 as needed during calibration. However, during standard comparison operations switches 665 are left open.

The capacitors 609 are also connected to voltage nodes 610 ($V_a$), which operate as the voltage nodes 610 of FIG. 9. The voltage nodes 610 are also connected to the gates of differential transistors 825. One side of each differential transistors 825 is coupled together and to transistor 827. The other side of each transistor 825 provides the output of the integrating amplifier 805 via output lines 830P and 830N which are provided to the analog latch circuitry 810. Connected between the gate of each transistor 825 and the outputs 830 is a transistor 826. Transistor 826 operates to perform the function of the auto-zero switches 620 of FIG. 9. The input to each transistor 826 is the ZEROB signal which indicates when the auto-zero step of the calibration sequence is to be performed.

In operation, the output currents of the differential transistor pair 825 feed into a cross-coupled p-channel network connected in unity-gain positive feedback. This structure ideally presents an infinite differential impedance to the currents from the differential transistors 825. Thus the differential output voltage of the amplifier will be a time-integration of the differential input voltage, with a time constant determined by the transconductance of the differential pair and the total capacitance at the output nodes. Since this structure has memory, a p-channel switch is included to reset it before each conversion cycle.

More particularly, the integrating amplifier outputs 830P and 830N are coupled together through transistor 831 which is controlled by a gate signal AMP. Transistor 831 operates as the switch 951 of FIG. 9. When the AMP signal goes low, the integrating amplifier 805 is reset. The source and drain of transistor 831 are each also connected to one of a pair of transistors 832 which are controlled by gate signals which are connected to transistors 833 as shown. The parasitic capacitances of transistors 832, 833, 825, 831, 840, and 826 together form the capacitors 950 of FIG. 9. In an exemplary embodiment, the capacitance of capacitor 950 may be approximately 30 fF and the $g_m$ of the integrating amplifier may be 212 micro-siemens which yields a time constant of approximately 141 psecs. The integrating amplifier 805 also includes a bias current source 828 which is connected to a transistor 829. The gates of transistors 829, 822, and 827 are all tied together as shown.

The outputs 830P and 830N of the integrating amplifier 805 are provided to a pair of analog latch input transistors 840. The input transistors 840 are connected between $V_{DD}$ 820 and nodes 855P or 855N as shown. The nodes 855P and 855N are coupled to $V_{DD}$ through transistors 856 and coupled to ground through cross-coupled transistors 850. The gates of transistors 850 are also connected to the gates of transistors 852 as shown while the gates of transistors 856 are also coupled to the gates of transistors 858 as also shown. The analog latch 810 operates in response to a LATCH signal and LATCHB signal. The LATCH signal is provided to transistors 842 while the LATCHB signal is provided to transistor 844. The outputs of the analog latch 810 are provided at output nodes 846 (the SETB signal) and output node 848 (the RESETB signal). The transistor 844 operates as a switch in response to the LATCHB signal such that when the LATCHB signal goes low the connection between nodes 855P and 855N through the transistor 844 is opened and either the SETB or RESETB signal is pulled down hard. This effectively converts the analog voltage level of the amplifier and the analog latch to digital levels compatible with the digital latch. Thus in response to the LATCHB signal, transistor 844 operates as the switch 952 of FIG. 9 and transistors 842, 855, and 858 operate in response to the LATCH signal as the level converter 967 of FIG. 9A.

The SETB and RESETB outputs of the analog latch are provided to the digital latch circuitry 815. The digital latch circuitry 815 may include digital latches 630 and 635, such as SR flops as shown. The outputs of the latch 630 are provided to the NAND gates 634. The NAND gates 634 also receive as inputs the ADC clock signal. The outputs of the NAND gates 634 are provided as inputs to the latch 635. The outputs of the latch 635 are provided through inverters to provide the outputs 816 of the comparator 430.

As mentioned above, the switch 951 of FIG. 9 (which corresponds to transistor 831 of FIG. 9A) is controlled by the AMP signal. When the AMP signal is HIGH the switch is opened and the output voltage of the integrating amplifier 615 is free to swing. When the AMP signal is LOW, the integrating amplifier output is forced to 0 (i.e. in the differential embodiment of FIG. 9A there is no differential voltage between the two outputs 830p and 830n). Thus, the amplifier is reset to a known condition every conversion cycle, and integration starts from zero for each conversion. The switch 952 of FIG. 9 (which corresponds to transistor 844 of FIG. 9A) is controlled by the LATCH signal inverse, LATCHB to operate as a reset switch for the analog latch. When LATCHB is low, switch 952 is opened and the output of the analog latch will quickly swing up or down depending on the polarity of the signal integrating amplifier 805 outputs 830p and at the moment when switch 952 is released. While the analog latch is inactive, in response to the LATCH signal the transistors 842, 852, and 858 operate as the level converter 967 of FIG. 9 to hold both analog latch outputs high so that the digital latch 630 is in the don't care state. Thus, the final result of the comparison will be exclusively dependent on the polarity of the output of the integrating amplifier 805 at the time instance defined by the rising edge of the LATCH signal (or the falling edge of LATCHB).

Figure 13:
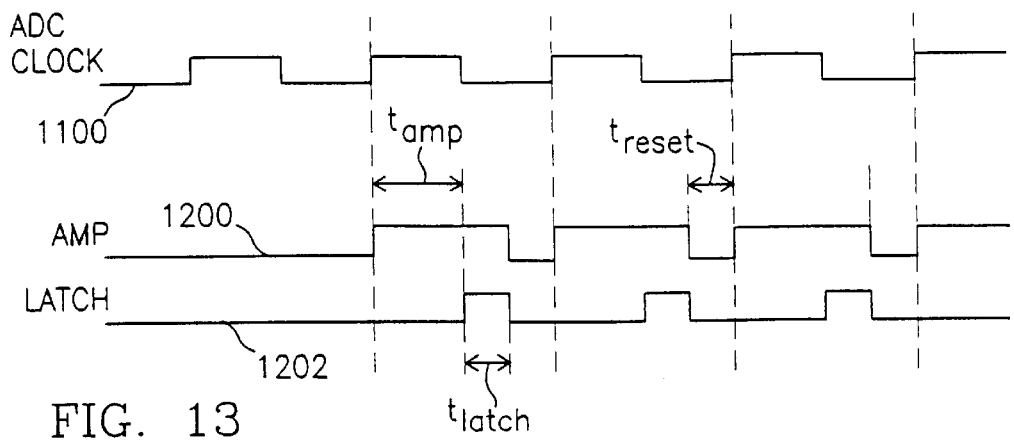
FIGS. 13 and 14 are timing diagrams for the comparator when utilized to perform conversions.

The timing diagram for the signals controlling the comparison process is shown in FIG. 13. When the ADC is to first begin comparisons, the comparator may first be calibrated as discussed below in more detail. The auto-zero and calibration procedures charge the capacitor 609 to provide a floating constant voltage source. The input switch 530 may then be connected to the analog voltage to be sampled, voltage $V_{in}$ 510. As shown in FIG. 13, at the beginning of the comparison cycle both the AMP signal 1200 and the LATCH signal 1202 are LOW. By keeping this signals low, the switches 951 and 952 are kept closed, and thus the integrating amplifier 615 output and the analog latch 625 output are kept at zero, a well defined initial condition.

When the AMP signal goes HIGH, the output of the integrating amplifier 615 is released. The integrating amplifier 615 and the capacitor 950 together form an ideal integrator which will integrate the input signal for the duration of time the AMP signal 1200 stays HIGH. Thus, the output of the integrating amplifier 615 will depart from 0 and will follow a trajectory governed by the integration of the input signal. For the time period that this integration is occurring and the LATCH signal 1202 is low, indicated by $t_{amp}$ on FIG. 13, the output of the analog latch will remain at zero. When the LATCH signal 1202 goes high, the analog latch 625 is released and the output of the analog latch 625 will go to a high or low value depending on what value the output of the amplifier 615 is at (i.e., the value of the integration of the $V_{in}$ signal 510 over the $t_{amp}$ period). The analog latch output may then be synchronized to the ADC system clock through the digital latches 630 and 635 prior to being provided as the comparator output at outputs 520.

After the analog latch is released and its output goes high or low, the output will remain at the value initially latched at the rising edge of the LATCH signal 1202 until the LATCH signal falls. As shown in FIG. 13, the LATCH signal 1202 remains high until the AMP signal 1200 also falls. When the AMP signal 1200 falls, the integrating amplifier 615 is reset to a zero output and is thus ready to commence another comparison. The amplifier reset period is shown in FIG. 13 as $t_{reset}$. In this fashion, the analog input $V_{in}$ 510 is repeatedly sampled and converted to a digital value. Essential to the result of the comparison is the value of the amplifier 615 output voltage when the rising edge of the LATCH signal arrives. In a mathematical sense, the important result is the integration end-point after a fixed amount of time defined by the interval between the rising edge of the AMP signal and the rising edge of the LATCH signal, denoted here as $t_{amp}$. Therefore the integration is executed on $t_{amp}$-wide slices of the input signal and every integration cycle starts from a zero point. Thus, this analog to digital sampling technique may be denoted as a sliced integration technique. The sliced integration technique allows the flash ADC to be implemented without using a front-end track/hold circuit. Further, the sliced integration technique shown herein does not suffer from recovery from overdrive induced distortion problems.

Figure 14:
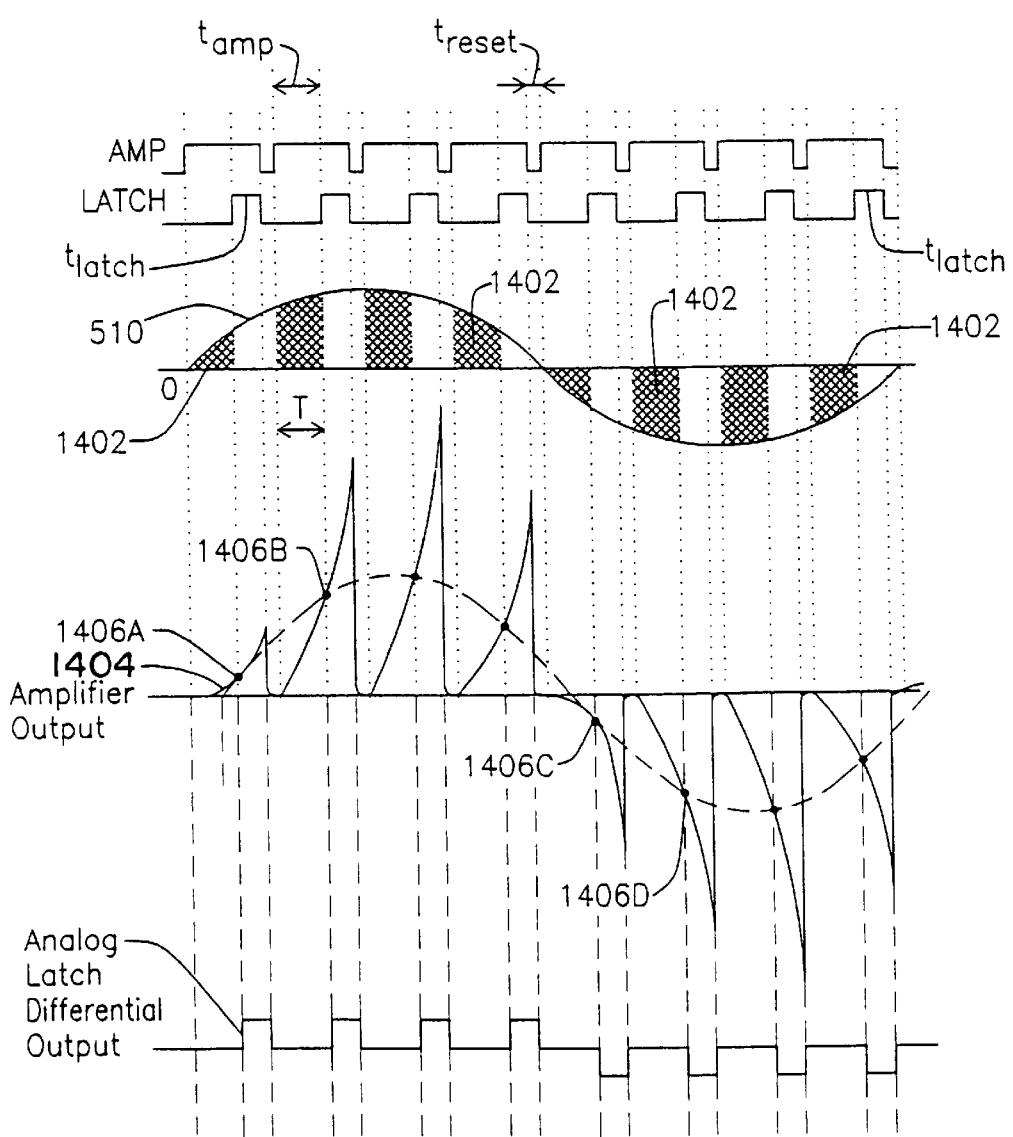

Graphically, the sliced integration may be seen in FIG. 14. As shown in FIG. 14, an example analog input voltage to the comparator voltage $V_{in}$ signal 510 is provided. The shaded areas 1402 under curve of the signal 510 indicate the area of the curve that will be integrated during the $t_{amp}$ period. The output of integrating amplifier is shown as signal 1404. The value of the output of the amplifier at the end of each $t_{amp}$ period (when LATCH goes high) is denoted as points 1406A, 1406B, 1406C, and 1406D. The value of the output 1404 at each point 1406A, 1406B, 1406C, and 1406D determines whether the analog latch will be held high or low during the $t_{latch}$ period. Thus, as shown in FIG. 14, the latch will be held high for the $t_{latch}$ periods beginning at points 1406A and 1406B and held low for the $t_{latch}$ periods beginning at points 1406C and 1406D.

The sliced integration technique described above allows the value of the capacitor 609 which provides the floating reference source to be relatively large. Further, the size of the capacitor 609 impacts that rate that the capacitor 609 will need to be refreshed as smaller capacitors will leak the stored reference value quicker. In the exemplary embodiments discussed herein, the capacitor 609 may be refreshed with the reference voltage approximately at a rate of one refresh every 1 msec while conversions may occur at a rate of one conversion every 4 nsec. Thus, thousands of conversions may occur without the need of refreshing the capacitor 609. The refresh rate allows the capacitor 609 to be refreshed when the comparator calibration is performed. In practice with a magnetic hard disk which operates in alternating read and servo operations, the calibration may take place at the beginning of each read segment of data and each servo segment of data and in optical media, for which the read and servo data are not time multiplexed the calibration may occur whenever a comparator is taken off line, as discussed in more detail below. Thus in summary, the differential voltage present on a given amplifier's series capacitors 609 determines the threshold of that comparator. The initialization of this voltage takes place during an auto-zero and calibration cycle. During this time, the input switches 817 and 818 of FIG. 9A are switched to the resistor ladder reference voltages, driving the series capacitors to a differential reference voltage.

The clocking of the comparators thus proceeds in three phases. First, the integrating amplifier and analog latch are reset by turning on their respective reset switches. Next, the amplifier is released and allowed to integrate the differential difference between the analog input signal and threshold voltages. This integration occurs for a fixed amount of time, $t_{amp}$, which may be determined by a delay chain in a clock generation circuit. Finally, the analog latch is released and allowed to regenerate. Depending on the latch decision, either SETB or RESETB will be pulled to the negative rail, tripping the digital latch.

Figure 12:
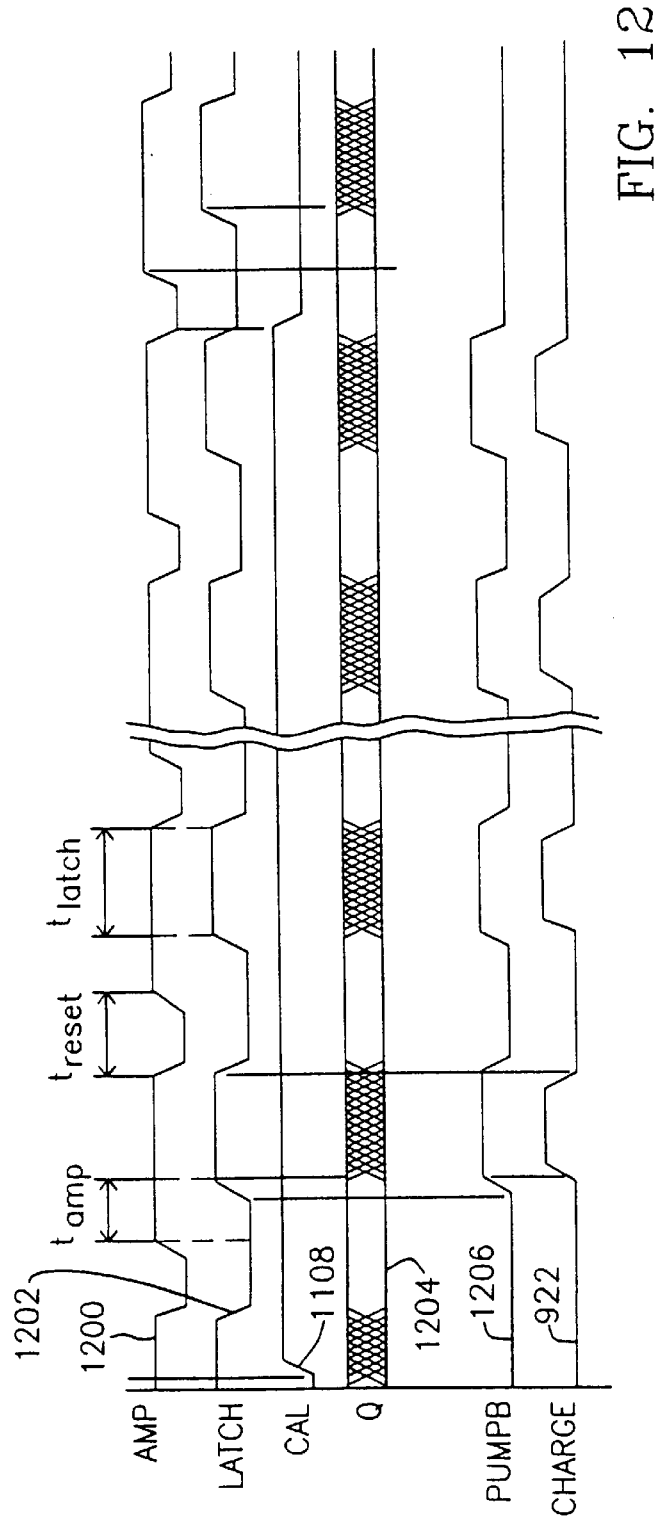

The time periods for the application of the of the AMP and LATCH signals shown in FIG. 13 may vary depending on system clock speeds and design choices. For example, the ADC may typically be clocked (clock signal 1100) at frequencies ranging from 50 to 350 MHz. The AMP signal may operate at the same speed as the clock signal. Further, as shown in FIG. 12 the $t_{reset}$ time (the time at which the AMP signal is low) may typically range 0.5 to 1.0 nsec, the $t_{amp}$ time (the integration time between the AMP signal going high and the LATCH signal going high) may typically range from 1.0 to 1.5 nsec and the $t_{latch}$ time (the time that the LATCH signal is high) will be the remainder of the period of the system clock. As mentioned above, in an exemplary embodiment the capacitance of capacitor 950 may be approximately 30 fF and the $g_m$ of the integrating amplifier may be 212 micro-siemens which yields a time constant of approximately 141 psecs. With the amplifier integration times described herein, the gain of the amplifier may thus be approximately on the order of 7x.

The sliced integration operation provides an approximately linear operation. Linear operation is desirable in order to maintain the accuracy of the comparison and thus maintain an accurate flash ADC employing this comparator approach. It may be noted that on any given conversion cycle, typically one comparator in the array will make the critical decision which will determine the output code. Thus not all integrators (amplifiers) need operate linearly on every cycle. Linear input range of the differential pair, output headroom and integration time may thus be chosen to maintain linear operation over the input conditions of the worst-case critical comparator.

A large portion of actual flash ADC non-linearity is generated by non-idealities in the comparator implementation used in the comparator array. Predicting the total harmonic distortion of the flash ADC, composed of a plurality non-ideal comparators with quantifiable non-idealities, is desirable. The linearity analysis may involve the following considerations:

(1) A flash ADC will output a digital number which is the numerical representation of the threshold voltage (one member of the $V_1, V_2, \ldots, V_N$ reference voltages) connected to the comparator that is the closest to the point of indecision. The point of indecision for a comparator is the input voltage for which the output of the comparator is maintained in a state of unstable equilibrium. This voltage is exactly the threshold voltage in some comparator implementations but is not necessarily restricted to it.

(2) A finite quantization error flash ADC maps ranges of the continuous input voltage space into points in the digital domain.

(3) A 0 quantization error flash ADC maps every point $V_{in}$ of the continuous input voltage space into a corresponding point in the digital domain. As described in the first item, this point is the numerical representation of the threshold voltage that would keep the comparator at the point of indecision when $V_{in}$ is applied at the input.

If the mapping operation described in item 3 is a linear operation, then the flash ADC will introduce no distortion. One method to test the linearity of the mapping operation is to perform the mapping on a sine wave input set of voltages. The mapping output is a set of threshold voltages that should arrange themselves on a sine wave if and only if the mapping operation is linear. By analyzing the spectral composition of the mapping output, one could quantify how close to linear is the mapping operation. The Total Harmonic Distortion (THD) of the mapping output corresponds directly to the portion of the THD of the ADC output that is due to comparator non-idealities.

For a general comparator having the input signal $v_{in}$ connected in series with a reference threshold voltage source $V_{ref}$ that together form the input of the comparator, the comparator may characterized by the general transfer function, $f(x)$. Further, the comparator will reach the point of indecision when $f(x)=0$. In other words, in order to calculate the output of the mapping operation solve for $V_{ref}$ in the following equation:

$$f(v_{in}-V_{ref})=0$$

In order to estimate the THD of the flash ADC, $v_{in}$ may be selected to be a sine wave:

$$v_{in}=V_{in}\cos(\omega t+\phi)$$

Further, in the particular case when the comparator is implemented using the sliced integration concept disclosed herein, the function $f(x)$ takes the following form:

$$f(x) = \frac{g_m}{C} \int_0^T x\, dt$$

Wherein T is the time $T_{amp}$ as used above with reference to FIGS. 12–14. For every phase $\phi$ of the input signal, the threshold $V_{ref}$ may be calculated which solves the following equation:

$$\frac{g_m}{C} \int_0^T [V_{in}\cos(\varpi t + \varphi) - V] = 0$$

The resulting V ($\phi$) is:

$$V(\varphi) = V_{in} \cdot \text{sinc}\left(\frac{\varpi T}{2}\right) \cdot \cos\left(\frac{\varpi T}{2} + \varphi\right)$$

The equation above shows that the sliced integration concept is a linear operation. The resulting V ($\phi$) is a sinusoidal function of $\phi$. The Fourier transform of V ($\phi$) will not show any harmonics. Note, however, that while the sliced integration technique will not introduce any non-linear (harmonic) distortion, it will introduce linear distortions. This corresponds to a frequency dependency of the magnitude and phase of the converted signal.

Substituting $f(x)$ for any non-linear voltage transfer function allows the designer to analyze the effect of a particular non-ideality on the overall ADC performance. For example, the physical implementation of the sliced integration comparator utilizes a NMOS differential pair as a transconductor. The non-linear V-I transfer function of the differential pair can be easily modeled and imbedded in the $f(x)$. The same is true for the non-constant output impedance of the differential pair with respect to the output voltage swing. Taking each non-ideality separately and quantifying its effect onto the final ADC THD allows the designer to size the transistors in the differential pair relative to the amplitude of the input sine wave and the integration time.

The sliced integration comparator technique disclosed herein provides a number of advantages over the prior art (such as shown in FIGS. 1C and 1D). First, by not utilizing a track/hold operation the reference voltage storage capacitor may be large and thus may store the reference voltage for long periods of time. Because of this storage time benefit, the sliced integration comparator may perform a long burst of comparisons between refreshes of the capacitor. This also allows for dynamic calibrations to take place at every refresh of the capacitor as described below. Further, the reference generators will rarely need to settle switching transients as opposed to once every conversion cycle in past embodiments since the sliced integration comparator stores the reference voltage and compares it against the input voltage. The sliced integration comparator also allows the input voltage to swing freely and the amplifier may integrate a moving input signal. Further, a shorter amplifier reset time is needed because the reset time need only be a sufficient time to bring the amplifier output to zero. Finally, the sliced integration comparator executes the latching operation within the same ADC clock cycle as the comparison is performed.

Calibration

In order to obtain improved performance from the ADC 320, each comparator 430 may be calibrated as disclosed herein. The methods and structures for calibrating a comparator need not be limited to calibrating the comparators of a flash ADC, but rather may be applied to any comparator in which calibration is desirable. However in a preferred embodiment, it is particularly advantageous to utilize the calibration techniques disclosed herein for calibrating a flash ADC, and more particularly, for calibrating a flash ADC utilized within a data channel circuit. Though the calibration techniques are described herein with reference to FIGS. 5–12 for a single comparator, the same techniques may be utilized for each comparator of the flash ADC.

Figure 5:
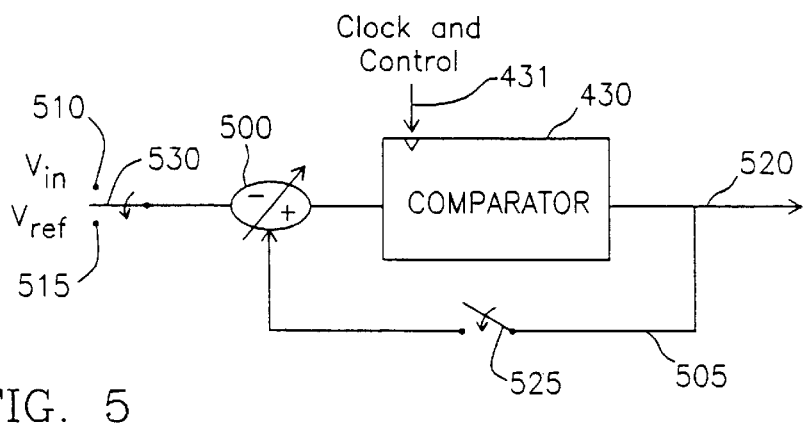
FIG. 5 is a block diagram of a circuit for implementing ADC calibration techniques according to the present invention.

As shown in FIG. 5, the comparator 430 is provided with circuitry which allows for calibration of the comparator under standard operating conditions such that both static and dynamic offsets may be calibrated. In particular, comparator 430 is provided with a feedback loop 505 which provides feedback from the comparator output 520 to an adjustable voltage input 500. Within the feedback loop 505 is provided a switch 525 which may be closed as shown by the arrow during a calibration mode while left open when analog to digital conversions are occurring. Also provided is a standard voltage input 510 (such as an analog input at which analog voltages from a disk drive may be presented). In addition to the $V_{in}$ input 510, a calibration voltage input 515 ($V_{ref}$) is also provided. The calibration voltage input 515 ($V_{ref}$) may be the ADC reference voltage such as generated from the reference voltage 400 and associated resistors 420 as shown in FIGS. 4 and 4A. An input switch 530 selects between the $V_{in}$ and $V_{ref}$ inputs depending upon whether analog to digital conversions are occurring or whether the comparator is placed within a calibration mode. During calibration, the input switch 530 is switched as shown by the arrow such that the $V_{ref}$ input is selected. Though some of the various input and outputs of the circuits shown herein are displayed as single ended signals for conceptual purposes (such as within FIG. 5), it will be recognized that full differential embodiments may be implemented for all the embodiments described.

FIG. 5 represents a block diagram of a circuit which will provide adjustability to a comparator's thresholds by using a feedback loop to adjust the thresholds. Calibration of dynamic offsets in addition to calibration of static offsets may occur by operating the comparator at standard clocking frequencies during the calibration. Thus, the ADC implements a self-calibration scheme which compensates for both static and dynamic sources of offset, internal to each comparator. Following the initial auto-zero operation, each comparator is clocked as it will be during actual conversion, but with its input still connected to the reference voltage ladder. Ideally, after auto-zero the comparator would be exactly at its threshold, and its output would thus be undetermined; however, due to as-yet-uncompensated static and dynamic offsets, the comparator may still have either a high or low output. The calibration scheme utilizes these mismatch-induced decisions to adjust the differential voltage stored on the amplifier's series coupling capacitors, essentially forming a negative feedback control loop such that the comparator's threshold is adjusted increasingly close to its ideal reference value.

FIG. 6 illustrates a more detailed circuit block diagram for implementing the principles shown in FIG. 5. As shown in FIG. 6, inputs 510 and 515 are selectively connected to the comparator through the input switch 530 as discussed above for calibration operation or ADC operation. The switch 530 is connected to a buffer amplifier 605 which has an output connected to two capacitors 607 and 609. The capacitor 609 is also connected to a voltage node 610 ($V_a$). Thus, the comparator input is AC coupled to a voltage node 610 ($V_a$). The capacitor 607 has a capacitance value of C while the capacitor 609 has a capacitance value seven times the value of C (7C). The buffer amplifier 605 serves to isolate the ADC comparators 430 from each other so that loading effects between comparators and other interactions while performing the calibration are minimized.

The voltage node 610 is provided as an input to an integrating amplifier 615. Though the calibration techniques disclosed herein are discussed with reference to an integrating amplifier, it will be recognized that the calibration techniques may be utilized with many types of amplifiers. Switch 620 operates as a reset switch and is closed as shown by the arrow during the auto-zero sequence. The switch 620 is reopened when the auto-zero operation is completed. The output of integrating amplifier 615 is provided to an analog latch 625 which provides an output to a digital latch 630. The output of the digital latch 630 is provided through NAND gates 634 to a second digital latch 635. The calibration signal CALB 632 (as utilized herein, inverted signals are indicated by the notation "B") is also provided as inputs to the NAND gates 634. The outputs of the second digital latch 635 provide the outputs 520 of the entire comparator structure. These outputs 520 may then be provided to encoding logic such as shown in FIG. 4.

The outputs of the first digital latch 630 and the second digital latch 635 are also provided to up/down logic 645. The up/down logic 645 provides a signal which controls a switch 650. In response to the up/down logic 645, switch 650 selectively connects a $V_{down}$ voltage 655 or a $V_{up}$ voltage 660 to one side of the capacitor 607. A pump switch 665 is also provided for use during the calibration operation. When closed, the pump switch 665 connects the capacitor 607 to the voltage node 610 ($V_a$). The pump switch 665 is normally closed during standard ADC operation, however, as discussed in more detail below, the pump switch 665 is toggled open during certain periods of the calibration procedure.

The calibration techniques disclosed herein may be viewed as a two-step calibration. First an auto-zero step is performed and then a second dynamic calibration step is performed. When one desires to calibrate a comparator in the ADC, the input switch 530 is connected to the $V_{ref}$ input 515 to provide a reference voltage to the system. Switch 620 is then closed. Operation of the input switch 530 and switch 620 in this manner performs an auto-zero operation which may account for static offsets by setting the node $V_a$ to the bias voltage of the integrating amplifier 615. Thus, when the switches are closed as described, the amplifier and latches may be biased to account for the static offset. After the auto-zero step is performed, the switch 620 is then opened again.

In addition to an auto-zero step for static offsets, the calibration technique for the circuit of FIG. 6 also allows for calibration of dynamic offsets by performing a second calibration step. The dynamic offsets may be compensated for during the second calibration step because the comparator is run (i.e. clocked) at standard operation speeds with the input switch 530 still set to connect to the circuit to the $V_{ref}$ input voltage 515. This sets the digital output 520 to a high or low value depending on the value of the dynamic offset of the comparator. After the dynamic offset has set the digital outputs to a high or low value, the calibration continues by application of the calibration signal 632 (CALB) to the gates 634 to hold the second digital latch in either the high or low value. The CALB remains low for the remaining during the remaining sequences of the calibration procedures until it is determined that calibration has been completed. Thus, the second digital latch remembers which voltage direction the input voltage to the integrating amplifier 615 ($V_a$) should be adjusted in order to compensate for the dynamic offsets. After the calibration signal 632 (CALB) goes low, voltage at node $V_a$ is repeatedly adjusted in small increments by adding or removing a small amount of charge stored on the capacitor 607 (C) until the comparator reaches its actual desired threshold, at which point calibration is halted.

The voltage adjustment is performed by repeatedly implementing a series of adjustment steps. These adjustment steps first include clocking the comparator, then comparing the outputs of the first digital latch 630 and the second digital latch 635 through use of the up/down logic 645. If the comparison of the outputs of the first digital latch 630 and the second digital latch 635 indicates that the outputs of each latch are the same, then the up down logic 640 generates a signal 646 which indicates that a voltage adjustment, either upward or downward, is necessary. When a voltage adjustment is necessary, the pump switch 665 is opened to disconnect the capacitor 609 and 607. The switch 650, is set to connect either the $V_{up}$ node 660 or the $V_{down}$ node 655 to the capacitor 607 momentarily (charging capacitor 607 up or down slightly) depending upon whether the $V_a$ voltage node 610 needs to be moved up or down respectively. Then, the switch 650 is disconnected from the $V_{up}$ or $V_{down}$ nodes. Finally, the pump switch 665 is closed, thus sharing the charge between capacitor 607 and capacitor 609 and moving the $V_a$ voltage node 610 up or down slightly. Because the capacitance of capacitor 607 is only one-eighth the combined capacitance of capacitors 607 and 609, the amount of incremental voltage change may be very small compared to the LSB voltage of the ADC. It will be recognized, however, that the chosen capacitance values and ADC bit accuracy may vary depending upon a designer's specific specifications and requirements, particularly with regard to total calibration range verse the resolution of the calibration.

The adjustment procedure is repeatedly performed, moving the $V_a$ voltage node 610 incrementally in the same direction until the digital latch 630 and the digital latch 635 have different outputs. The first detection of different output values on the digital latches indicates that between two adjustment cycles the comparator output has changed (from high to low or vice-versa) which thus indicates that the comparator has reached its actual threshold voltage and calibration should be halted. Normal comparator operations may then proceed and the comparators that are calibrated may be placed back into the array. During ADC operation, the calibration process described may occur repeatedly to maintain system accuracy. Thus, for example in magnetic hard disk applications, calibration may occur at the beginning of each servo data read operation and each disk data read operation (i.e., twice each disk sector) or in optical disk applications in which no time division break between read and servo data operations occurs, the calibration may occur on a comparator by comparator basis whenever a comparator is taken off line as described in more detail below. Example calibration frequencies may be between 60 Hz and 100 kHz.

Figure 7:
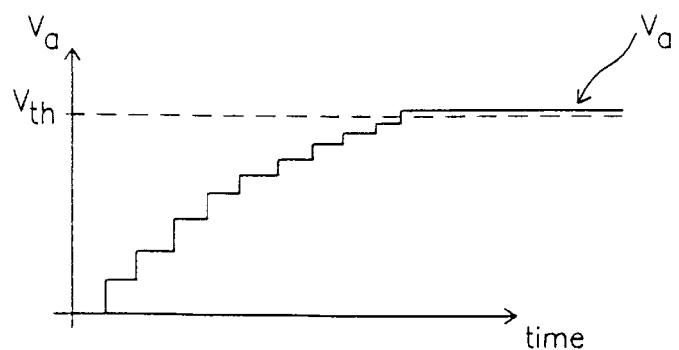
FIG. 7 is a graph of a voltage node of the circuit diagram of FIG. 6 during calibration.

As described above, each comparator may be cycled through a series of one or more incremental voltage adjustments to compensate for the dynamic offsets until the actual threshold $V_{th}$ is reached. FIG. 7 illustrates a demonstrative representation of the voltage at the voltage node 610 ($V_a$) versus time during the calibration. As can be seen from FIG. 7, the adjustment voltage $V_a$ is incrementally adjusted until $V_a$ first exceeds $V_{th}$ where $V_{th}$ is the actual threshold of the comparator due to dynamic and static offsets. As seen in FIG. 7, the $V_a$ voltage steps decrease with each step for improved accuracy. The decay in the voltage steps occurs due to the RC nature of the switched capacitor circuit utilized. The values of $V_{up}$ and $V_{down}$ may be chosen such that the difference between $V_{up}$ and $V_{down}$ is six LSBs (approximately 96 mV). The generation of $V_{up}$ and $V_{down}$ is discussed in more detail below. Generally, the switch 650 is closed sufficiently long to fully charge capacitor 607. Typically, switch 650 may be closed for approximately 1 nsec. In one six bit ADC embodiment, the first step may be one-fourth an LSB or approximately 4 mV. In this case the worst case error between two comparators would be one-half an LSB (one-fourth an LSB for each comparator).

Figure 7A:
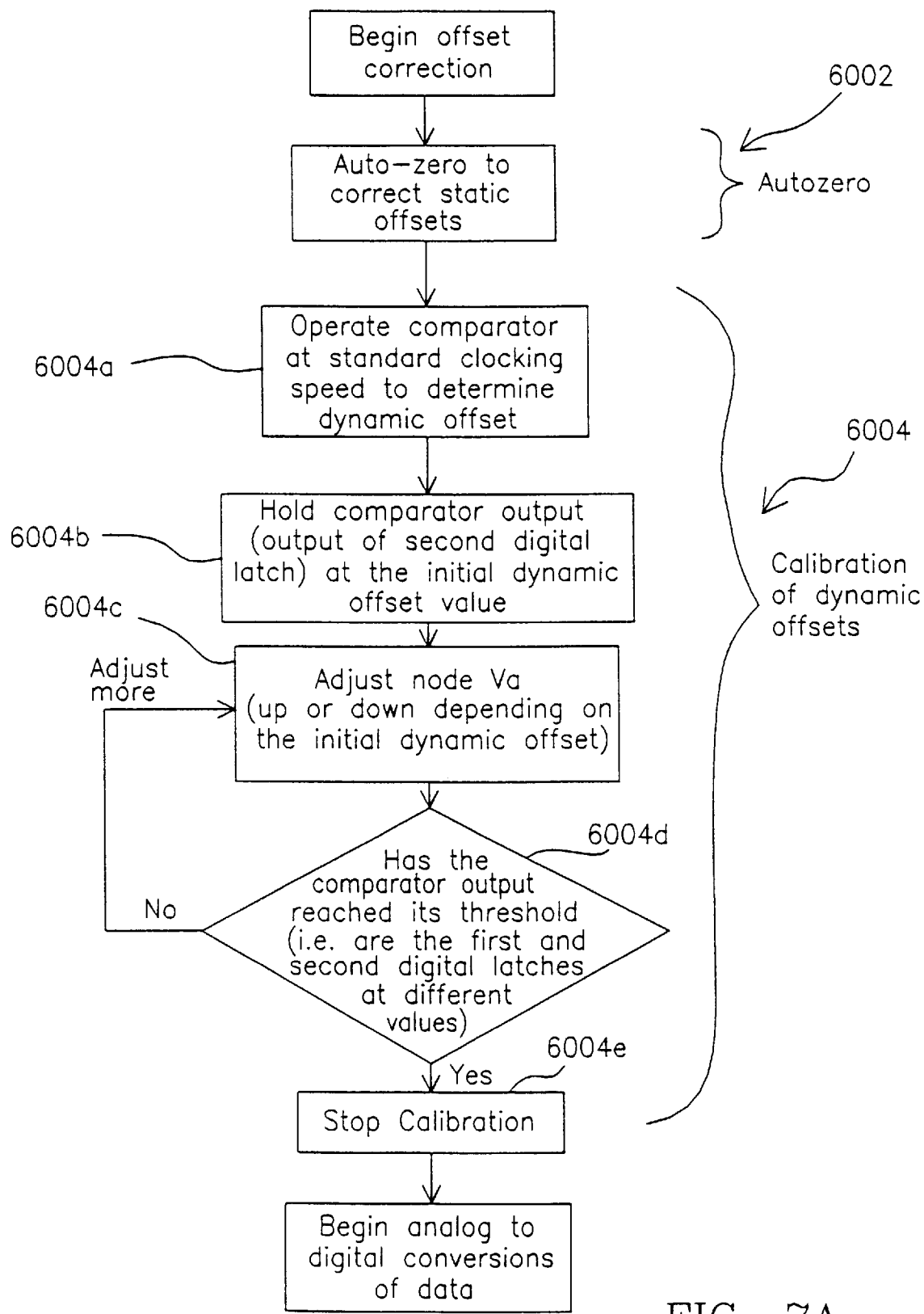
FIG. 7A is a flowchart of one embodiment of the calibration procedure disclosed herein.

A summary of one embodiment of the calibration steps described above may be seen in the flow chart of FIG. 7A. As shown in the flow chart of FIG. 7A, the offset correction process disclosed herein includes an auto-zero step 6002 to correct for static offsets and a calibration of dynamic offsets procedure 6004 which calibrates the dynamic offsets. The calibration of dynamic offsets procedure 6004 includes the sub-steps 6004*a–e*. As shown in the figure, after the auto-zero step 6002 the comparator is then operated at standard clocking speeds to determine the dynamic offsets within step 6004*a*. Next, step 6004*b* is performed to hold the comparator output (the output of the second digital latch 635) at the initial dynamic offset value. Next, step 6004*c* is performed to adjust the voltage at node $V_a$ up or down depending upon the initial dynamic offset. Next, the comparator output is checked to determine whether it has reached its threshold (i.e., when the first and second digital latches have different values at their outputs). If the comparator has not reached its threshold, the voltage adjustment node step 6004*c* is repeated. When it is determined in step 6004*d* that the comparator output has reached its threshold, the calibration is stopped in step 6004*e*. After the calibration has been stopped, the comparator has been fully calibrated and is ready to begin performing analog to digital conversions of data.

Figure 8:
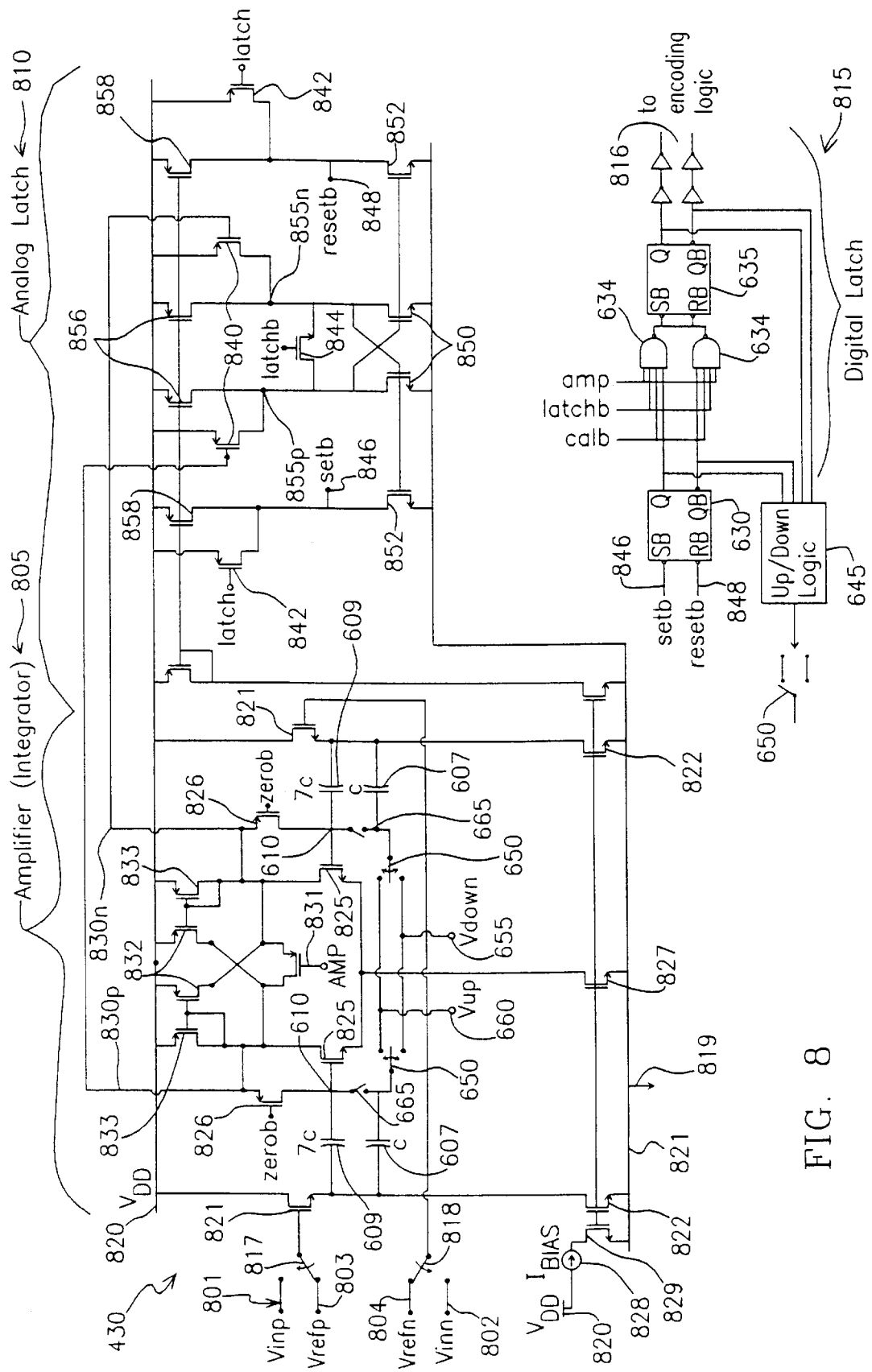
FIG. 8 is an exemplary circuit for accomplishing the ADC calibration techniques according to the present invention.

The calibration techniques shown herein may be utilized with a variety of comparator circuits and designs and the techniques need not be limited to a specific design. One preferred embodiment for use as the comparator 430 is shown in FIG. 8. As shown in FIG. 8, the comparator 430 may include three circuit blocks, such as an integrating amplifier 805, an analog latch 810, and a digital latch 815. The inputs to the comparator 430 may be differential inputs, such as analog voltage inputs $V_{inp}$ 801 and $V_{inn}$ 802 and the calibration voltage input $V_{refp}$ 803 and $V_{refn}$ 804. Input switches 817 and 818 are provided for selecting which of the inputs are connected to the comparator 430. The comparator also has an output 816 which may be provided to digital encoding logic, such as digital logic 490 of FIG. 4.

The signals at the inputs of the comparator 430 are first provided to the integrating amplifier 805. The integrating amplifier or 805 is of symmetrical design for the side of the integrating amplifier with like reference numbers utilized FIG. 8 for each symmetrical circuit element. The inputs to the integrating amplifier 805 are first provided to a pair of differential input transistors 821. The input transistors 821 are connected between $V_{DD}$ 820 and transistors 822. Transistors 822 are also connected to ground 819. The input transistors 821 are also connected capacitors 609 and 607 which have capacitance values of 7C and C respectively as shown in FIG. 8 and also described with respect to FIG. 6. In one preferred embodiment, the value of 8C may be 0.300 pF. Also connected to the capacitors 609 and 607 are a pump switches 665 and switches 650. As described above again with respect to FIG. 6, pump switch 665 is selectively opened or closed to isolate and connect capacitors 609 and 607 and switch 650 is selectively applied to the voltage up input 660 or the voltage down input 655 as needed during calibration. The capacitors 609 are also connected to voltage nodes 610 ($V_a$), which again operates similar to voltage node 610 of FIG. 6. The voltage nodes 610 are also connected to the gates of differential transistors 825. One side of each differential transistors 825 is coupled together and to transistor 827. The other side of each transistor 825 provides the output of the integrating amplifier 805 via output lines 830P and 830N which are provided to the analog latch circuitry 810.

Connected between the gate of each transistor 825 and the outputs 830 is a transistor 826. Transistor 826 operates to perform the function of the switch 620 of FIG. 6. The input to each transistor 826 is the ZEROB signal which indicates when the auto-zero step of the calibration sequence is to be performed.

The outputs 830P and 830N are also coupled together through transistor 831 which is controlled by a gate signal AMP. When the AMP signal goes low, the integrating amplifier 805 is reset. The source and drain of transistor 831 are each also connected to one of a pair of transistors 832 which are controlled by gate signals which are connected to transistors 833 as shown. The integrating amplifier 805 also includes a bias current source 828 which is connected to a transistor 829. The gates of transistors 829, 822, and 827 are all tied together as shown.

The outputs 830P and 830N of the integrating amplifier 805 are provided to a pair of analog latch input transistors 840. The input transistors 840 are connected between $V_{DD}$ 820 and nodes 855P or 855N as shown. The nodes 855P and 855N are coupled to $V_{DD}$ through transistors 856 and coupled to ground through cross-coupled transistors 850. The gates of transistors 850 are also connected to the gates of transistors 852 as shown while the gates of transistors 856 are also coupled to the gates of transistors 858 as also shown. The analog latch 810 operates in response to a LATCH signal and LATCHB signal. The LATCH signal is provided to transistors 842 while the LATCHB signal is provided to transistor 844. The outputs of the analog latch 810 are provided at output nodes 846 (the SETB signal) and output node 848 (the RESETB signal). The transistor 844 operates as a switch in response to the LATCHB signal such that when the LATCHB signal goes low the connection between nodes 855P and 855N through the transistor 844 is opened and either the SETB or RESETB signal is pulled down hard. This effectively converts the analog voltage level of the amplifier and the analog latch to digital levels compatible with the digital latch.

The SETB and RESETB outputs of the analog latch are provided to the digital latch circuitry 815. The digital latch circuitry 815 may include digital latches 630 and 635, such as SR flops as shown. The outputs of the latch 630 are provided to the NAND gates 634. The NAND gates 634 also receive as inputs the AMP signal, the LATCHB signal and the CALB signal. The outputs of the NAND gates 634 are provided as inputs to the latch 635. The outputs of the latches 630 and 635 are provided to the up/down logic 645 for determining a control signal for operating the switches 650 as described above with reference to FIG. 6. The outputs of the latch 635 are also provided through inverters to provide the outputs 816 of the comparator 430.

An alternative preferred embodiment for implementing the present invention is shown in FIG. 9. The circuit of FIG. 9 is similar to that of the circuit of FIG. 6; however, the circuit of FIG. 9 is drawn as a differential circuit, and more importantly, includes alternate embodiments for implementing the application of the $V_{up}$ and $V_{down}$ voltages and the up/down logic 645 of FIG. 6. As shown in FIG. 9, the $V_{up}$ and $V_{down}$ voltages connected through the use of switches 650 may be voltages which are supplied through a voltage stored across a capacitor. More particularly, as shown in FIG. 9, one switch 650 is connected to node 940 when a $V_{down}$ voltage is desired for that side of the amplifier and the other switch 650 is connected to node 942 to provide a $V_{up}$ voltage to the other side of the amplifier (or vice-versa). During calibration the voltage on node 940 is generated from a voltage stored across capacitor 904. In one embodiment the capacitance of capacitors 904 and 902 may be 2C (75 fF). The voltage stored on capacitor 904 is generated by closing switch 908 to connect voltage source 910 to the capacitor 904. Switch 908 is closed prior to the dynamic calibration steps and opened before the dynamic calibration begins. Likewise, the $V_{up}$ portion of the circuitry operates in a similar fashion by connecting a switch 650 to node 942 to receive charge stored on capacitor 902. Switch 906, as with switch 908, is closed prior to the dynamic calibration sequence and opened during calibration. Because the voltage source used for $V_{up}$ or $V_{down}$ is now a charged capacitor, the amount of charge incrementally applied to the capacitors 607 (and thus the amount of voltage adjustment at voltage nodes 610 ($V_a$)) is smaller for each repetition of the voltage adjustment. Voltage sources 910 ($V_{down}$) and 912 ($V_{up}$) may be each set at 3 LSBs (approximately 48 mV) offset from a voltage source 911. Voltage source 911 is set to provide a voltage $V_{abias}$ which is a voltage that matches the voltage at node 610 ($V_a$) immediately after the auto-zero step is performed.

In addition to the use of the modified $V_{up}$ and $V_{down}$ circuitry as shown in FIG. 9, the circuit of FIG. 9 differs from the circuit of FIG. 6 in that the up/down logic 640 of FIG. 6 has been modified. As shown in FIG. 9, the outputs of the first digital latch 630 are provided to a pair of gates 920. The gates 920 also receive a charge signal 922 which is indicative of time periods in which it is desired to connect switches 650 to either node 940 or node 942 in order to transfer or remove charge to and from capacitors 607. At the onset of dynamic calibration, the outputs of the first digital latch 630 indicate whether the voltage at node 610 ($V_a$) needs to be adjusted upward or downward. The combination of the outputs of first digital latch 630 and the charge signal as shown provides the upb signal 926 and the downb signal 928 as shown. The signals 926 and 928 in turn control switches 650.

FIG. 9A illustrates the $V_{up}$ and $V_{down}$ logic of FIG. 9 and the modified offset detection circuitry of FIG. 9 except the circuit of FIG. 9A illustrates a full transistor schematic. Moreover FIG. 9A illustrates the implementation of the circuits of FIG. 9 within a comparator 430 with like reference numbers and circuitry as shown and described above with reference to FIG. 8. Thus, the $V_{up}$ and $V_{down}$ logic of FIG. 9A may replace the $V_{up}$ node 660 and $V_{down}$ node 655 of the differential comparator circuitry as shown in FIG. 8 and the up/down logic 645 of FIG. 8 is replaced by the gates 920 of FIG. 9A.

As shown in FIG. 9A, each storage capacitor 904 and 902 is connected to each switch 650. In operation, switches 650 are controlled by the control signals 926 and 928 as shown in FIG. 9. At any given time that the switches 650 are connected to the up or down nodes, one switch 650 will be connected to the up node (node 942) while the other switch would be connected to the down node (node 940). Thus, during calibration the charge on each of the capacitors 940 and 942 will be gradually changing each time the switches 650 are connected to nodes 942 or 940.

Figure 9B:
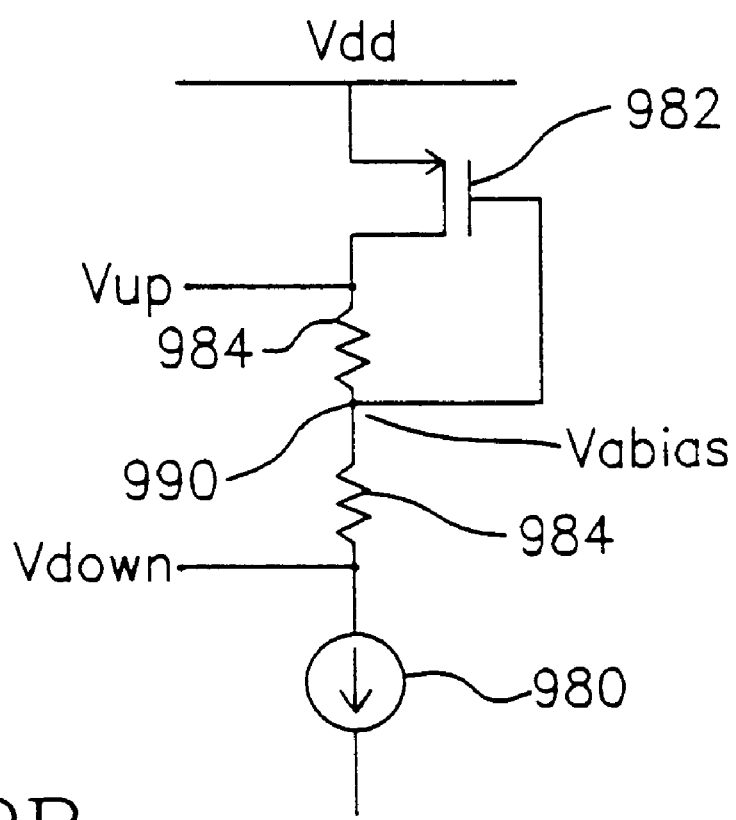
FIG. 9B illustrates a circuit for generating the $V_{up}$ and $V_{down}$ voltages.

FIG. 9B shows one example circuit for generating the $V_{up}$ and $V_{down}$ voltages. As shown in FIG. 9B, the voltage at node 990 ($V_{abias}$) is intended to replicate the voltage at node 610 ($V_a$) immediately after the auto-zero step is performed. This is accomplished by providing a current source 980 which replicates the current through transistor 827 of FIG. 9A when the auto-zero operation is completed and by providing a transistor 982 which replicates transistors 833 of FIG. 9A. Two resistors 984 are provided to generate the desired voltage difference between $V_{up}$ and node 990 and between $V_{down}$ and node 990.

Figure 10:
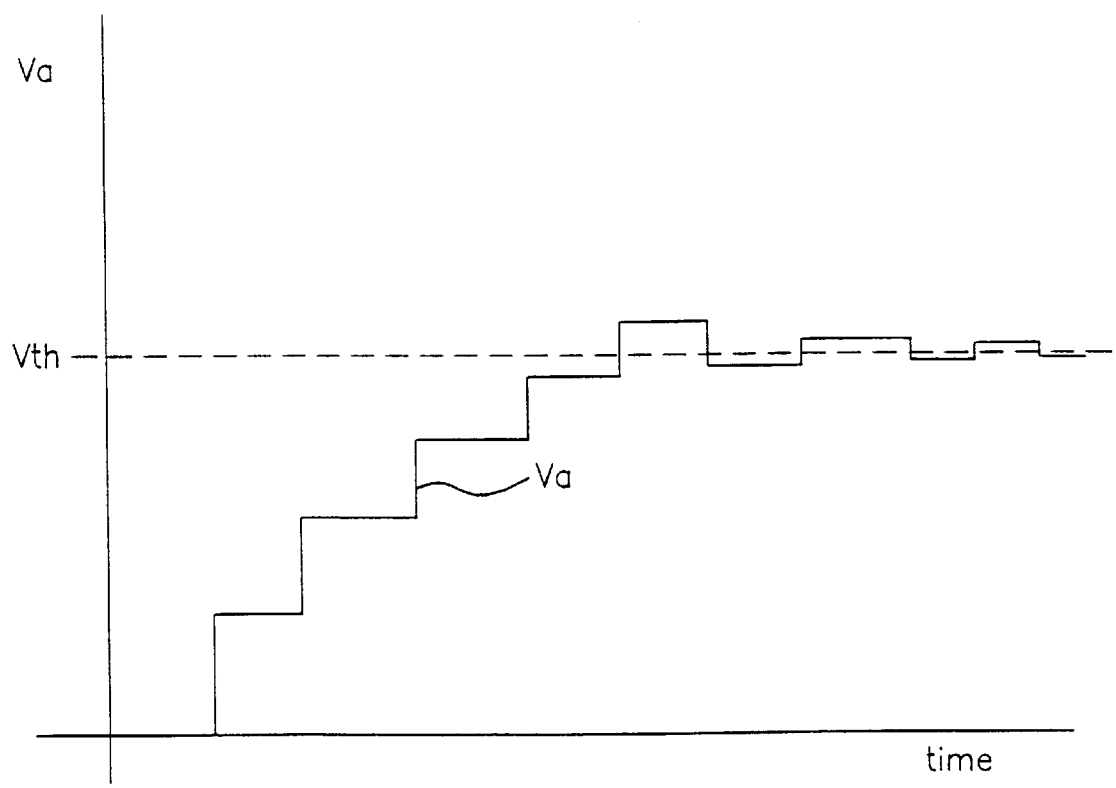
FIG. 10 is a graph of a voltage node of the circuit diagram of FIG. 9 during calibration.

In operation, the circuits of FIGS. 9 and 9A allow for simpler control circuitry than that of the circuits of FIGS. 6 and 8. In particular, within the circuit of FIG. 8, the voltage adjustments at node $V_a$ are continued until it is determined (within the up/down logic 645) that the output of the comparator had crossed the $V_{TH}$ level. However during calibration of the circuit of FIG. 9A, voltage adjustments are not ceased when the output voltage crosses the desired threshold voltage $V_{TH}$, but rather adjustments are continually made at predetermined time intervals or for a predetermined number of adjustments. Because the charge transferred from the capacitors 904 or 902 during each voltage adjustment is incrementally lessened during each voltage adjustment step, the voltage at node $V_a$ will continually change by smaller amounts. An example of this may be seen in FIG. 10. As shown in FIG. 10, the voltage at node $V_a$ changes by ever decreasing amounts. However, unlike the approach as shown in FIG. 7, when the voltage at node $V_a$ crosses the $V_{TH}$ point, the calibration does not stop, but rather continues. As shown in FIG. 10, after the voltage at node $V_a$ crosses the $V_{TH}$ value the voltage adjustments continue, however successive voltage adjustments may be of an opposite polarity with the voltage at node $V_a$ approaching the $V_{TH}$ value closer and closer with each adjustment. Because the magnitude of charge on each capacitor 904 and 902 is dropping with each voltage adjustment, when polarity changes of the voltage adjustment occur, the next voltage adjustment will still be less in magnitude than the previous adjustment.

Thus, during operation the embodiment of FIGS. 9, 9A, and 10 is performed for a predetermined interval rather than performed until a crossing of the $V_{TH}$ level is detected. In one embodiment the calibration may be set to operate for 10 voltage adjustment increments. The 10 calibration cycles may typically be clocked at frequencies between 50 MHz and 350 MHz.

Thus, a comparator is provided with a threshold-adjusting switch network provided as a control loop around the amplifier. The control loop includes logic which detects whether an up or down threshold adjustment is necessary. The result of the comparator's previous threshold decision is used to determine which direction to move the threshold. Prior to calibration, capacitors 902 and 904 are charged to reference voltages $V_{up}$ and $V_{down}$. This establishes a finite amount of charge in the calibration system. Capacitors 607 are for the purpose of transferring small amounts of this charge to the larger coupling capacitors 609 To move the threshold up, for example, capacitors 609 are disconnected from capacitors 607. Then capacitors 607 are connected to capacitors 902 and 904. Finally, capacitors 607 are disconnected from capacitors 902 and 904 and re-connected to capacitors 609. It is advantageous to have capacitors 902 and 904 present instead of simply voltage sources because during the self-calibration process a comparator can "overstep" its threshold. Thus, on the next calibration cycle, the connection polarity of the transfer capacitors to the reference capacitors results in a step in the opposite direction. By employing capacitors to supply the reference levels, their charge will be somewhat depleted by the time a step reversal occurs. On the other hand, the reverse step that would occur with fixed voltage sources may be large and may compromise the final accuracy of the threshold.

Figure 10A:
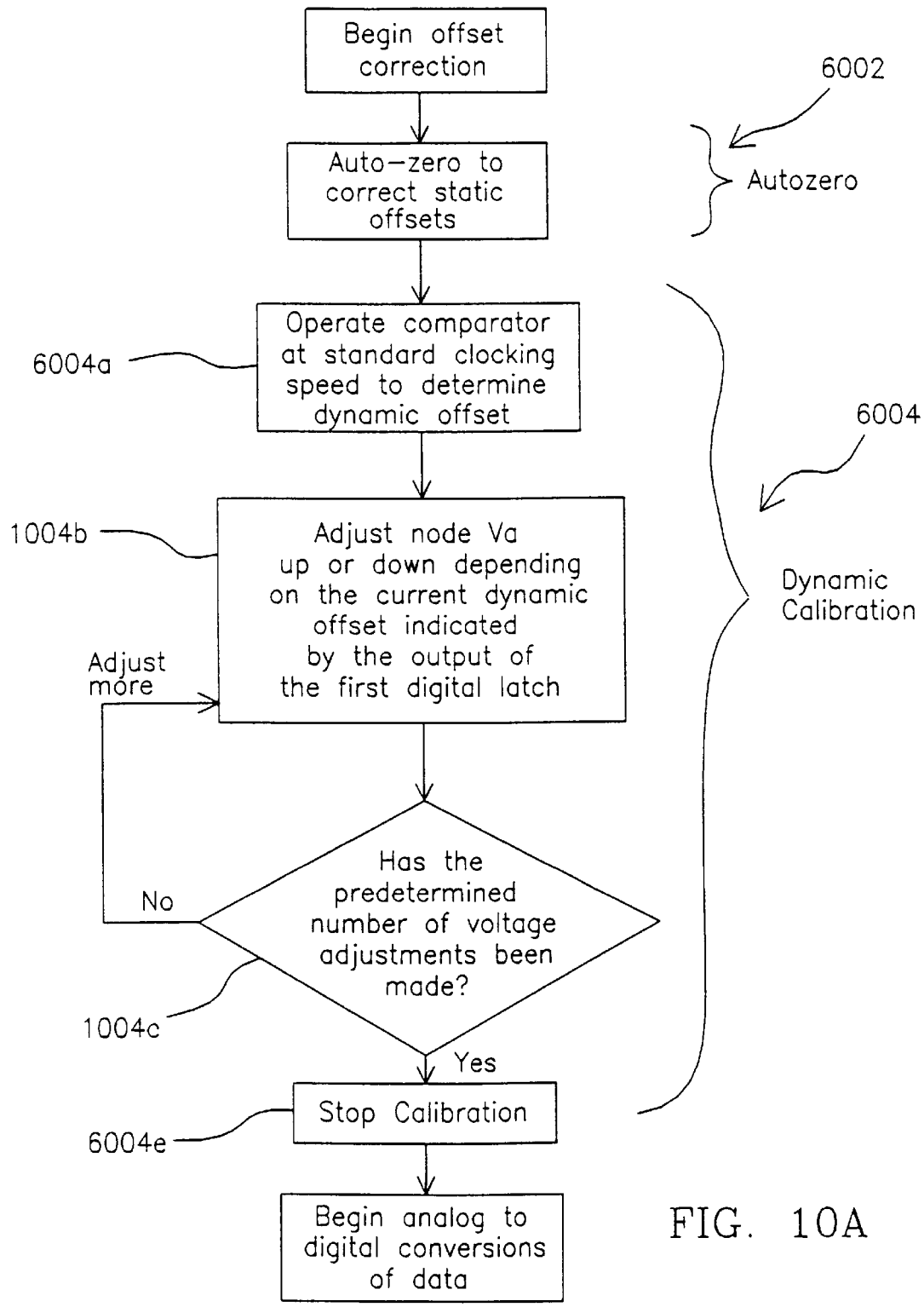
FIG. 10A is a flowchart of the calibration procedure disclosed herein within reference to the embodiment of FIGS. 9, 9A and 10.

A flow chart summarizing the steps of implementing the embodiments shown in FIGS. 9, 9A, and 10 is shown in FIG. 10A. The flow chart of FIG. 10A is similar to the flowchart of FIG. 7A except the dynamic calibration steps 6004b–d of FIG. 7A have been replaced with steps 1004b and 1004c. As shown in FIG. 10A, after the initial dynamic offset is determined in step 6004a, the voltage at node $V_a$ is adjusted depending upon what the current offset is as indicated by the output of the first digital latch 630. Then within step 1004c it is determined whether the predetermined number of voltage adjustments (or a predetermined time) has occurred. If not, control passes back to step 1004b for additional voltage adjustments. When the predetermined number of adjustments has occurred, the calibration procedure is halted as indicated by step 6004e.

Figure 11:
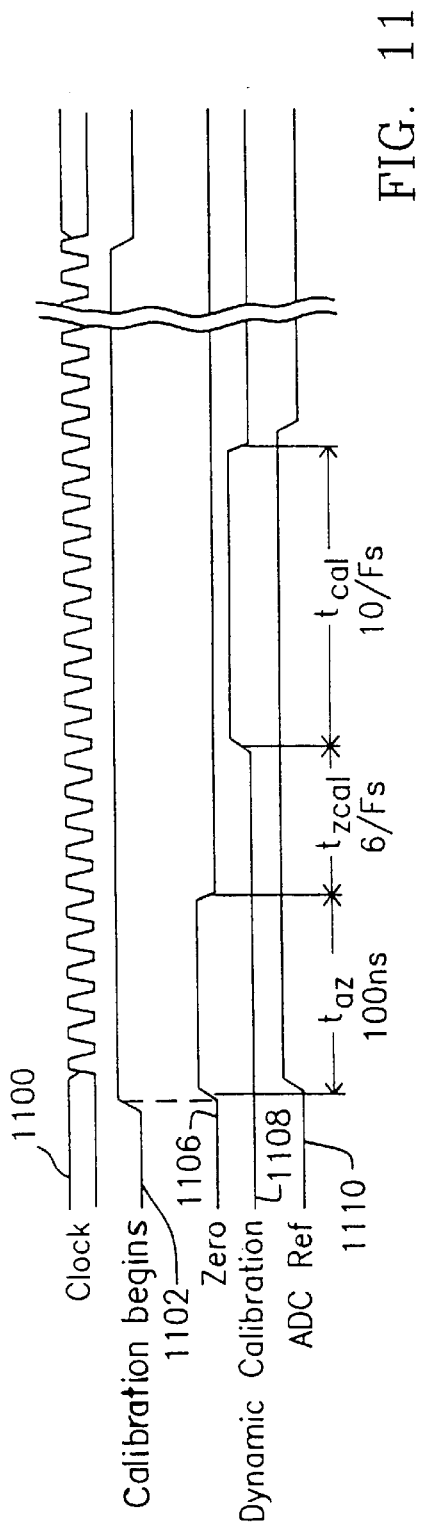
FIGS. 11 and 12 are timing diagrams of the calibration procedure disclosed herein within reference to the embodiment of FIGS. 9, 9A and 10.

Timing diagrams for implementing the circuits of FIGS. 9, 9A, and 10 are shown in FIGS. 11 and 12. FIG. 11 illustrates the relationship between the clock signal 1100, a calibration begin signal 1102 (which for magnetic hard disk applications could be a read or servo begin signal 1102), the ZERO signal 1106, the dynamic calibration signal (CAL) 1108, and the ADC REF signal 1110. As shown in FIG. 11, after the calibration begin signal 1102 is received to indicate the start of a calibration operation, an auto-zero procedure is commenced as indicated by the high application of the ZERO signal 1106 (the inverse of the ZERO signal, ZEROB, controls transistors 826 of FIG. 8). In addition, the ADC REF signal 1110 controls the input switches (switch 530 or switches 817 and 818) so that the reference voltages (for example $V_{ref}$ of FIGS. 6, 8, 9 and 9A) are coupled to the integrating amplifier through the input switches when the ADC REF signal 1110 is taken high. In the illustrative embodiment of FIG. 11, the auto-zero step may last for 100 ns. The dynamic calibration signal (CAL) 1108 indicates the period during which calibration may occur. As shown in FIG. 11, an illustrative example time for calibration time is $10/F_s$ (10 clock cycles). Between the period in which the auto-zero is accomplished and the dynamic calibration is accomplished, a time period ($t_{zcal}$) is provided so that the comparators may settle after the auto-zero step.

The operations which occur during the $t_{cal}$ period are shown with more detail in FIG. 12. In particular, FIG. 12 shows operations while the dynamic calibration signal 1108 is high. The AMP signal 1200, the LATCH signal 1202, the data signal (Q) 1204, the PUMPB signal 1206, and the CHARGE signal 922 are all shown. The AMP signal 1200 controls the transistor 831 and the LATCH signal 1202 (and its inverse LATCHB) control transistors 842 and 844 respectively as shown in FIG. 8. The data signal 1204 represents the outputs of the first digital latch 630 which may be provided to the gates 920 as shown in FIG. 9. The CHARGE signal 922 is the other input to the gates 920 as shown in FIG. 9. The PUMPB signal 1206 controls the operation of the pump switches 655 such that when PUMPB signal is low the pump switches 655 are closed and when the PUMPB signal is high the pump switches 655 are opened. After, the PUMPB signal goes high, charging of the capacitors 607 may occur and thus the CHARGE signal is taken high. After the CHARGE signal falls (and thus the switches 650 are no longer connected to the up or down nodes 940 and 942), the PUMPB signal falls causing the pump switches 655 to close, and thus change the voltage level at the voltage nodes ($V_a$) 610. In one illustrative embodiment, the dynamic calibration may include 10 incremental adjustments of the voltage $V_a$ which would correspond to 10 toggles of the PUMPB signal 1206 and the CHARGE signal 1208 while the CAL signal 1108 is high.

The time periods for the application of the of the AMP, LATCH, PUMPB, and CHARGE signals shown in FIG. 12 may vary depending on system clock speeds and design choices. For example, the ADC may typically be clocked (clock signal 1100 of FIG. 11) at frequencies ranging from 50 to 350 MHz. The AMP signal may operate at the same speed as the clock signal. Further, as shown in FIG. 12 the $t_{reset}$ time (the time at which the AMP signal is low) may typically range from 0.5 to 1.0 nsec, the $t_{amp}$ time (the integration time between the AMP signal going high and the LATCH signal going high) may typically range from 1.0 to 1.5 nsec and the $t_{latch}$ time (the time that the LATCH signal is high) will be the remainder of the period of the system clock. The PUMPB signal may be high for the same time as the LATCH signal. The CHARGE signal may go high approximately 0.25 nsec after the PUMPB signal goes high and the CHARGE signal may fall approximately 0.25 nsec before the PUMPB signal so pumping and charging do not occur at the same time.

Calibration During Conversions

As mentioned above, the comparators of a data channel circuit utilized for processing data from a magnetic storage medium may be conveniently calibrated simultaneously at the beginning of each read or servo sector. Thus, the time multiplexed nature of the data on a magnetic storage medium may be taken advantage of to provide an appropriate time to calibrate the comparators.

In optical storage systems, however, the data is generally stored continuously without a sector break with both user data and servo data frequency mutliplexed within the continuous data stream. Utilizing the concepts disclosed herein, individual comparators may be calibrated at random or psuedo-random times while the ADC is performing conversions without the addition of extra "proxy" or replacement comparators. Furthermore, the techniques disclosed herein do not significantly degrade the quality of the conversion. More particularly, with reference to FIG. 4, at periodic intervals a psuedo-random one of the comparators 430 may be disconnected or decoupled from the digital logic 490 for calibration. In order to prevent a significant degradation in the conversion quality, the digital logic 490 may be designed to provide the necessary adjustments to accommodate the removal of one of the comparators 430. Thus, a calibration technique is provided in which individual comparators are removed from the data conversion path during conversion and the downstream logic adjusts to accommodate for the removal of the comparator.

Figure 15:
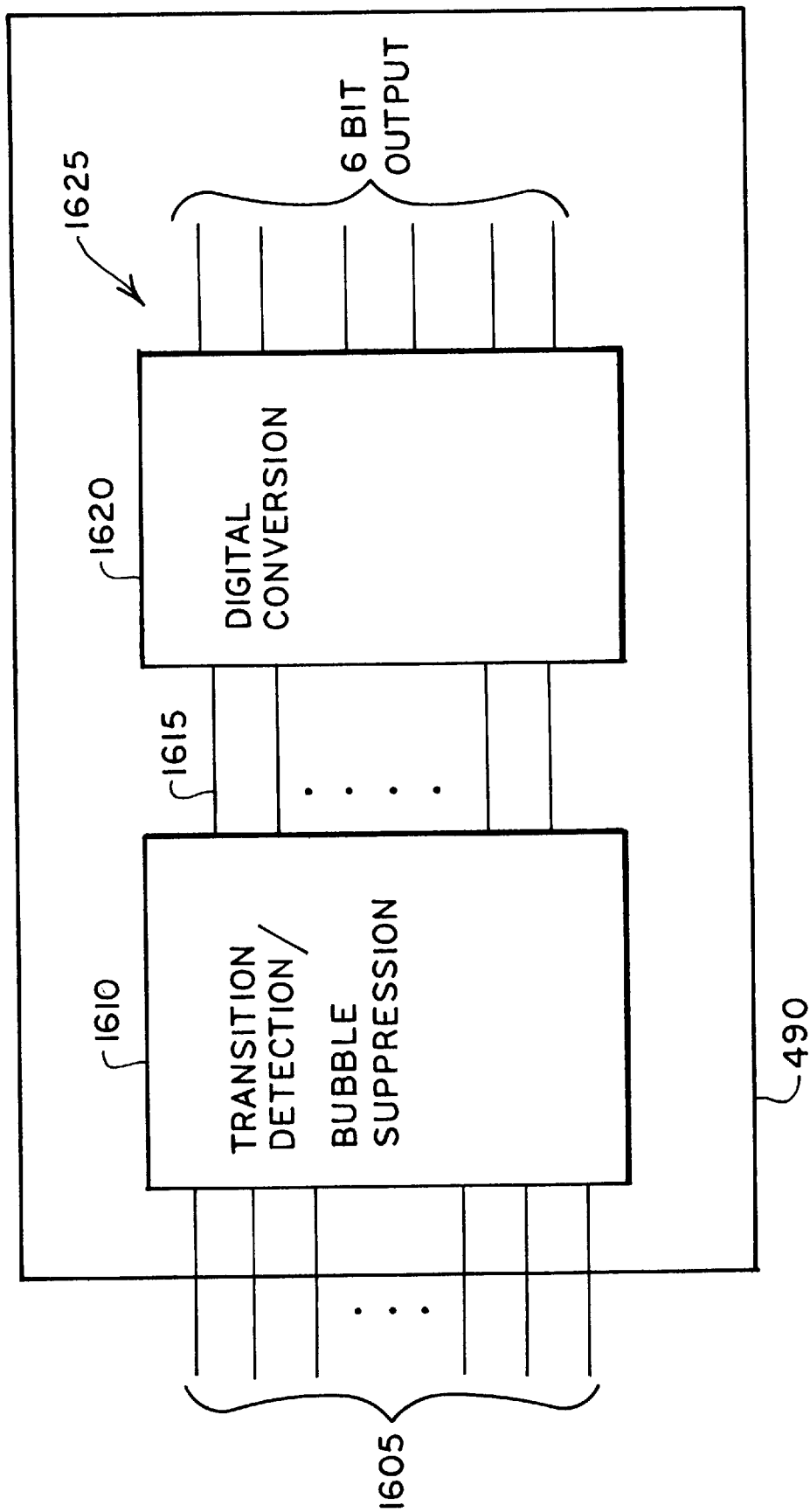
FIG. 15 illustrates digital logic for processing comparator output data.
Figures 16, 16A:
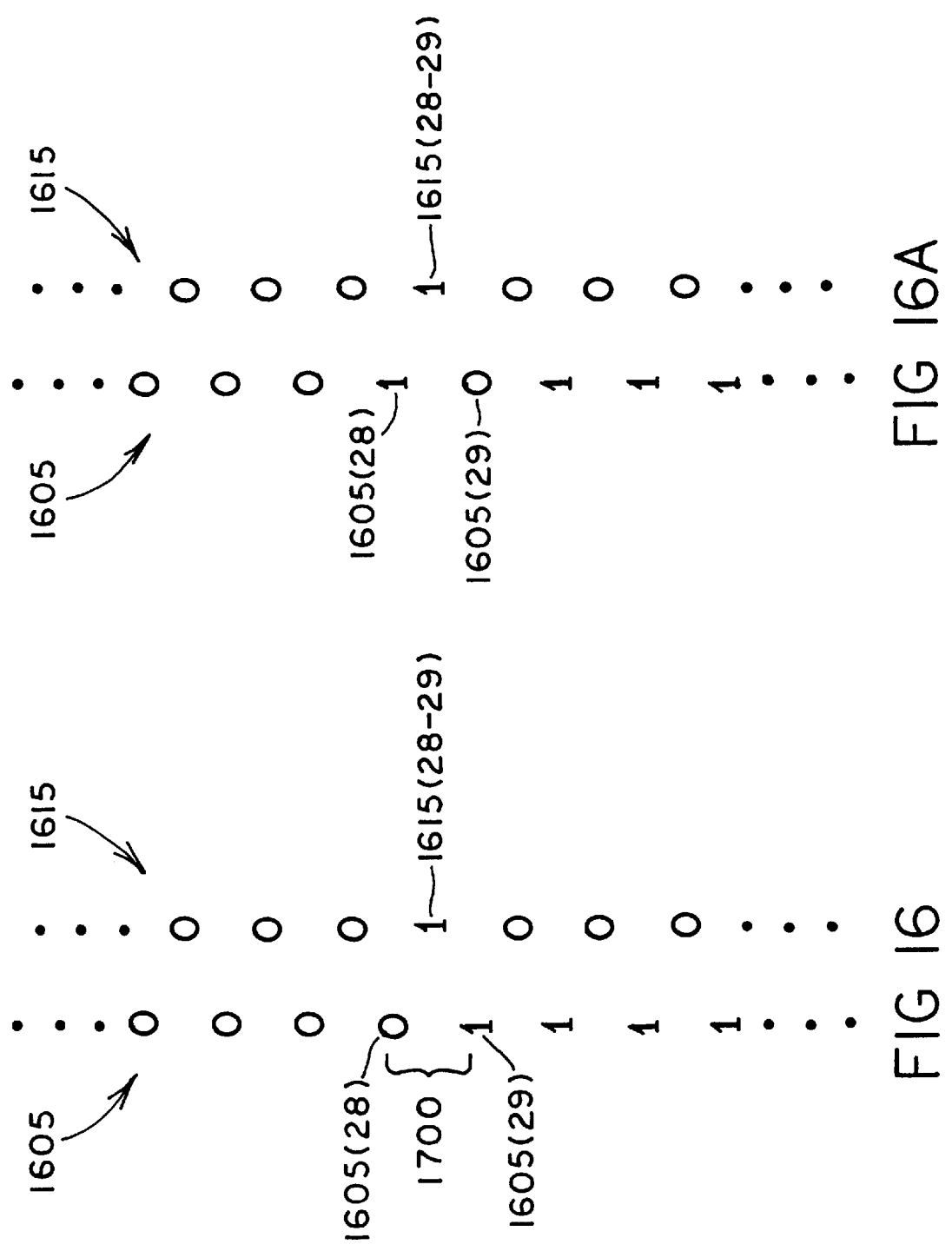

The calibration technique may be seen with more detail with reference to FIGS. 15–19C. As shown in FIG. 15, the digital logic 490 may include a plurality of inputs 1605 that are provided from the 63 comparators 430 (one input 1605 provided from each comparator 430). The inputs 1605 are provided to a transition detection/bubble suppression circuit 1610. The circuit 1610 determines where along the 63 comparator outputs the values of the outputs have transitioned from one digital state to another. The circuit 1610 then provides outputs 1615 which indicate between what two inputs 1605 the transition occurred. The outputs 1615 may indicate a transition by providing a digital 1 value at the desired output and providing a digital 0 value on all other outputs. The outputs 1615 are then provided to digital conversion circuitry 1620 which converts the conversion data to a six bit digital value on output lines 1625. The operation of the transition detection/bubble suppression circuit 1610 may be seen with more detail with reference to FIG. 16. In FIG. 16, example digital values are provided for the inputs 1605. Thus, in the example shown the transition 1700 indicates where the comparator outputs have switched from digital 1s to digital 1s. In this example the transition occurs at inputs 1605(28) and 1605(29). The corresponding digital values for the outputs 1615 of the transition detection/bubble suppression circuit 1610 are also shown. The specific output 1615(28–29), which is the output that is mapped to the two inputs 1605(28) and 1605(29) where the transition 1700 occurs, has a digital value of 1 to indicate the transition occurrence while all other outputs 1615 are at a digital 0 state.

Figures 16B, 16C:
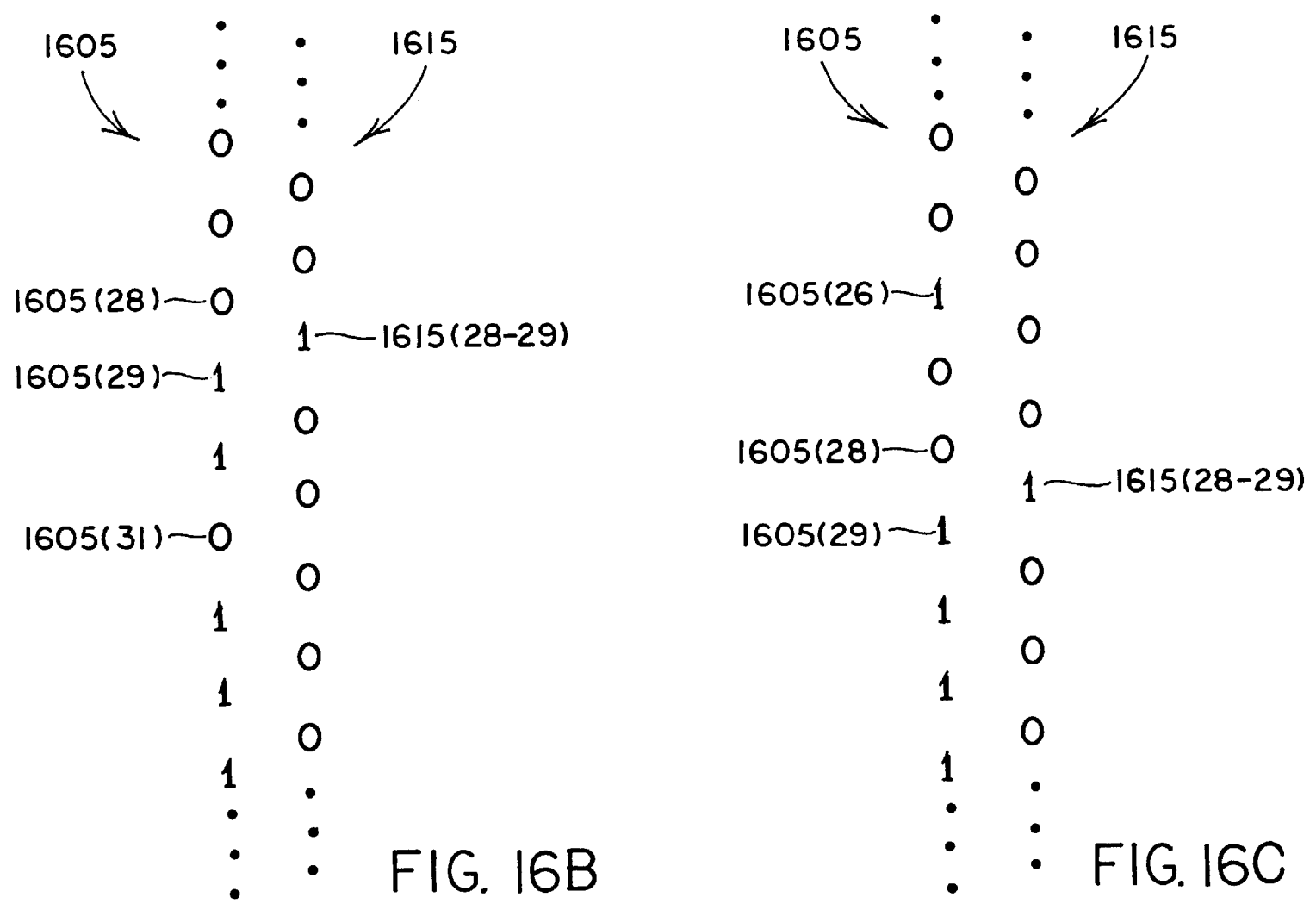

The transition detection/bubble suppression circuit 1610 also operates to suppress bubbles in the conversion data contained in inputs 1605. Bubbles in the data occur as a function of offsets, calibration errors or other data storage system errors. FIGS. 16A, 16B, 16C, and 16D show exemplary bubbles for the data on inputs 1605 and the corresponding data after bubble suppression on the outputs 1615. As shown in FIG. 16A a "one bubble one deep" type bubble is provided. Rather than the smooth transition from digital 1s to digital 0s as shown in FIG. 16, the data of FIG. 16A has a bubble in that a digital 0 is present on input 1605(29). The transition detection/bubble suppression circuit 1610 will provide a digital one at the output 1615(28–29) as the best estimate of the actual transition location. Similarly, FIGS. 16B and 16C illustrate "one bubble two deep" type bubbles in that an unwanted bubble is present at input 1605(31) for FIG. 16B and an unwanted bubble is present at input 1605(26) for FIG. 16C. In FIGS. 16B and 16C, the bubble suppression circuitry chooses output 1615(28–29) as the best estimate of the actual transition location. Finally FIG. 16D illustrates "one bubble three deep" type bubble in that an unwanted bubble is present at input 1605(32). The bubble suppression circuitry chooses output 1615(28–29) as the best estimate of the actual transition location in FIG. 16D.

Figure 18:
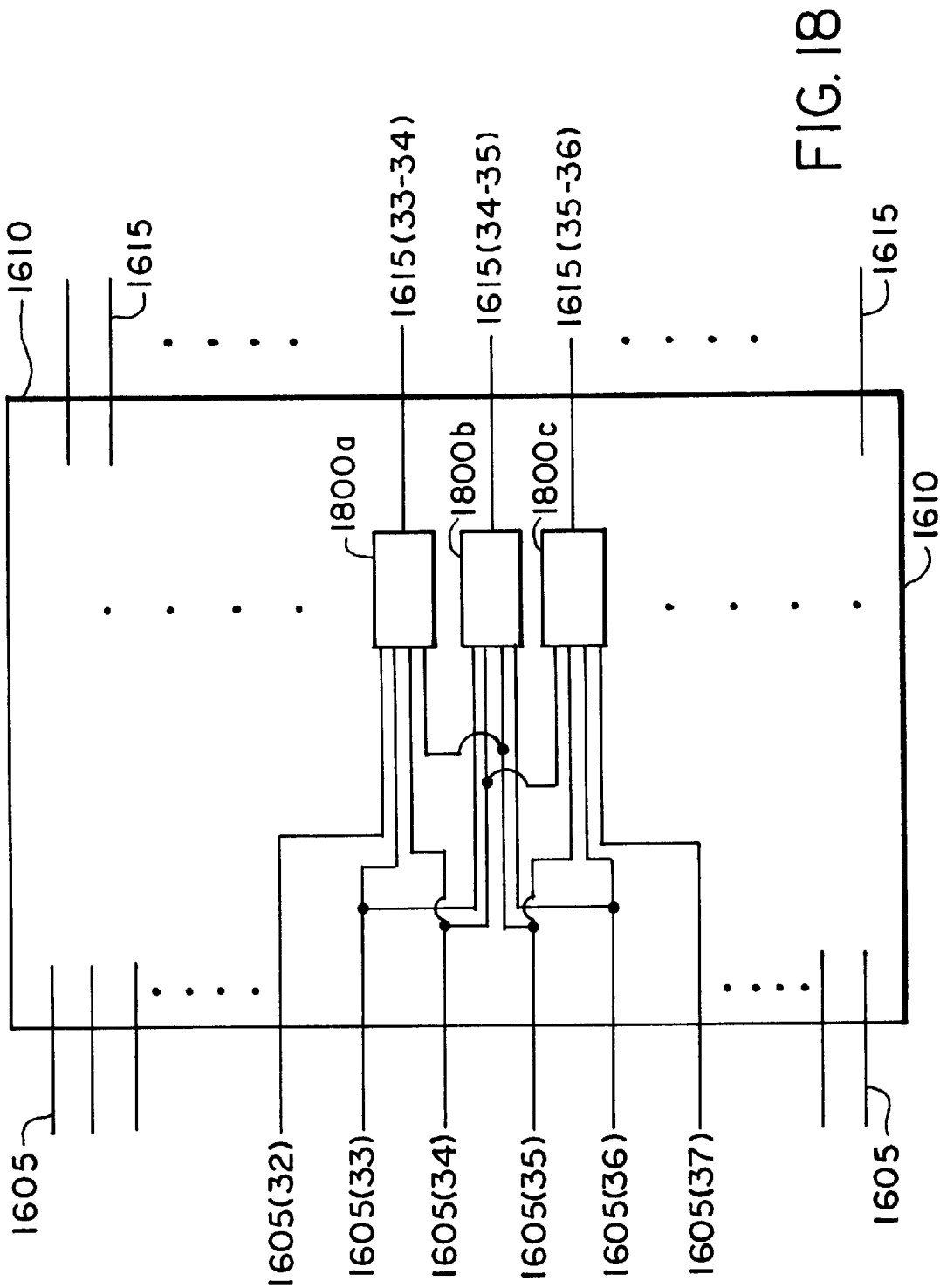
FIG. 18 illustrates a plurality of the circuits of FIG. 17.

The transition detection/bubble suppression circuit 1610 may be formed from a series of logic circuits, each logic circuit including two exclusive-or (EOR) gates and one AND gate. For demonstrative purposes one of these logic circuits is shown in FIG. 17 and a plurality of these logic circuits is shown in FIG. 18. As shown in FIG. 17, the one logic circuit 1800 of the transition detection/bubble suppression circuit 1610 is connected to four of the inputs 1605 (inputs 1605(33), 1605(34), 1605(35), and 1605(36)). The logic circuit 1800 is comprised EOR gate 1802 connected to inputs 1605(34) and 1605(35) and EOR gate 1804 connected to inputs 1605(33) and 1605(36). The output of each EOR gate is connected to AND gate 1806. The output of the AND gate 1806 provides the output 1615(34–35) which indicates whether a transition occurred between inputs 1605(34) and 1605(35).

The transition detection/bubble suppression circuit 1610 is formed from a plurality of logic circuits 1800, one provided for each output 1615. FIG. 18 illustrates three of the logic circuits 1800 (1800a, 1800b, and 1800c) for demonstrative purposes. As shown in FIG. 18, the outputs 1615(33–34), 1615(34–35), and 1615(35–36) are connected to logic circuits 1800a, 1800b, and 1800c respectively. The logic circuit 1800a receives as inputs inputs 1605(32), 1605(33), 1605(34) and 1605(35). The logic circuit 1800b receives as inputs inputs 1605(33), 1605(34), 1605(35) and 1605(36). The logic circuit 1800c receives as inputs inputs 1605(34), 1605(35), 1605(36) and 1605(37). The remaining inputs 1605 and outputs 1615 are connected in a like manner. Because of the EXCLUSIVE-OR and AND operations of the logic circuits 1800, the transition detection and bubble suppression functions as shown in FIGS. 16–16D will be accomplished.

Figure 19:
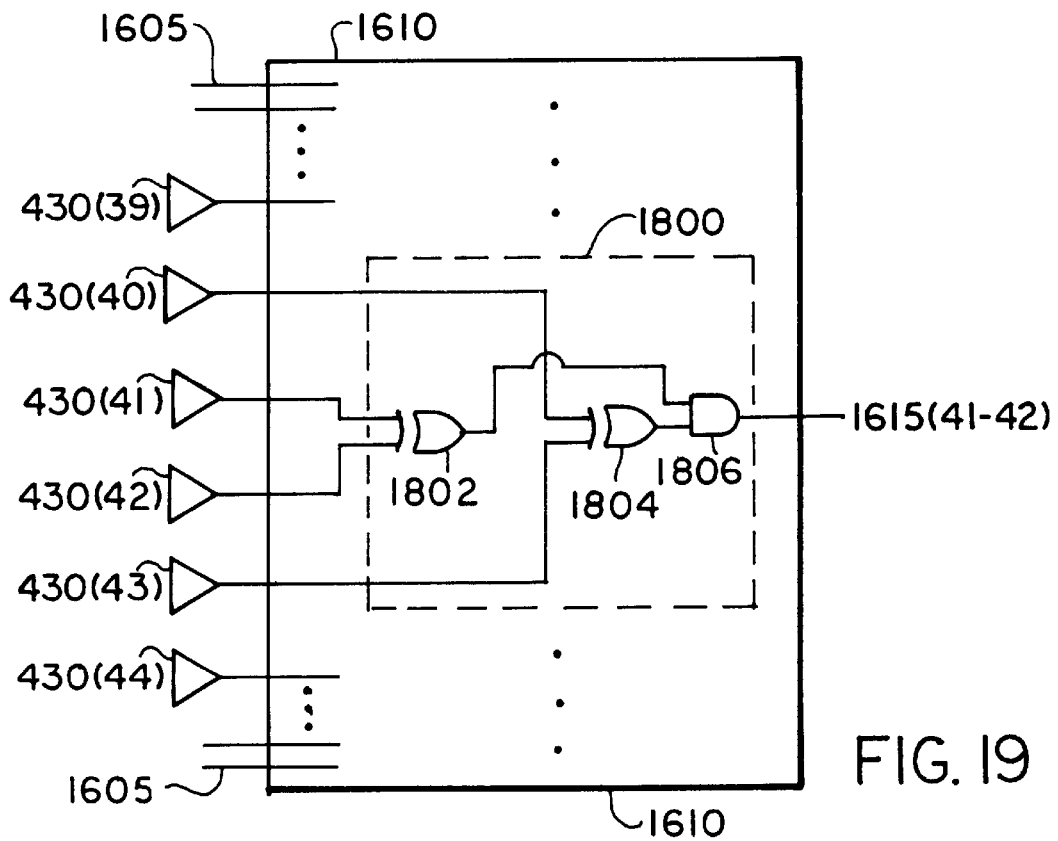
FIGS. 19, 19A, 19B, and 19C illustrate a system for calibrating comparators of an ADC while the ADC is performing conversions.

The transition detection and bubble suppression functions may be implemented in through the use of a number of suitable logic circuits selected by routine circuit design techniques. The circuits described above with reference to FIGS. 17 and 18 are particularly suited for use with optical disk data storage systems in which individual comparators may be calibrated while the ADC is performing data conversions. In order to accommodate for the calibration of comparators 430 of the ADC, adjustments to the circuitry of the transition detection/bubble suppression circuit 1610 are made when the auto-zero and calibration are performed. These adjustments are described below with reference to FIGS. 19–19C with respect to one of the logic circuits 1800. FIG. 19 illustrates the conditions as described above for standard operation when a comparator 430 is not being calibrated. As shown in FIG. 19, one logic circuit 1800 comprised of two EOR gates and one AND gate is connected to four inputs 1605 (for example 1605(40), 1605(41), 1605 (42), and 1605(43)) to provide the output 1615(41–42). Each of these four inputs is connected to a comparator 430 (for example comparators 430(40), 430(41), 430(42), and 430 (43)).

Figure 19A:
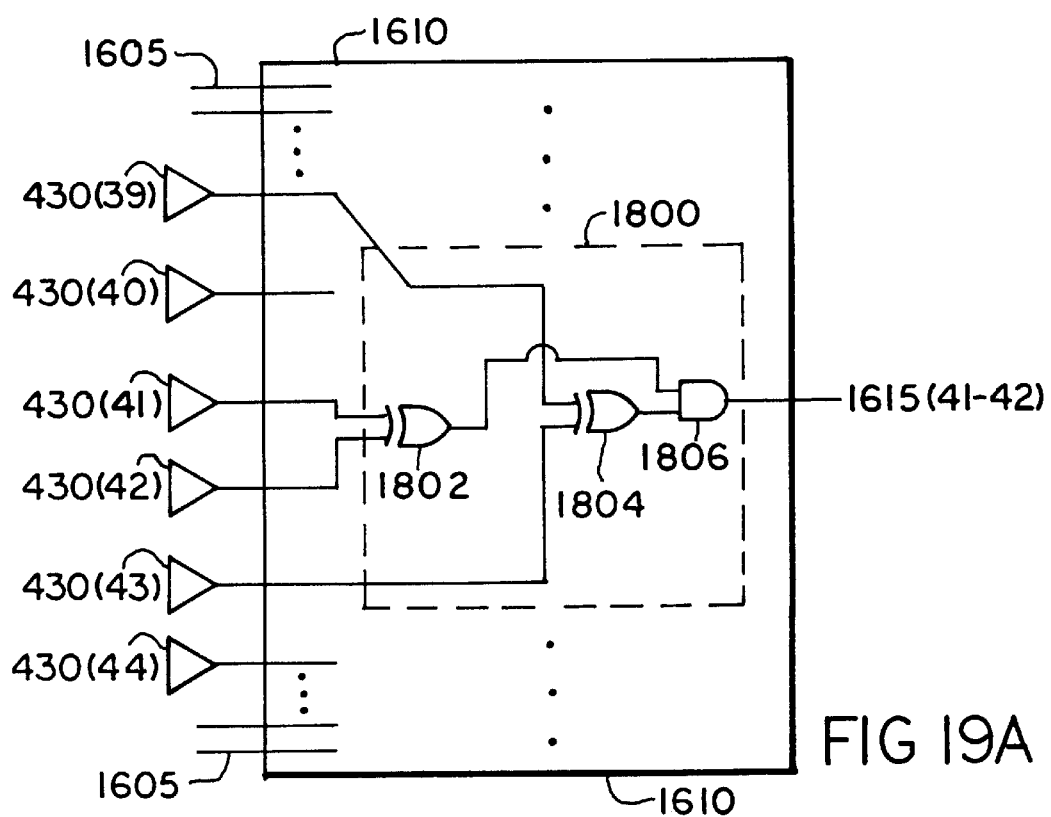
Figure 19B:
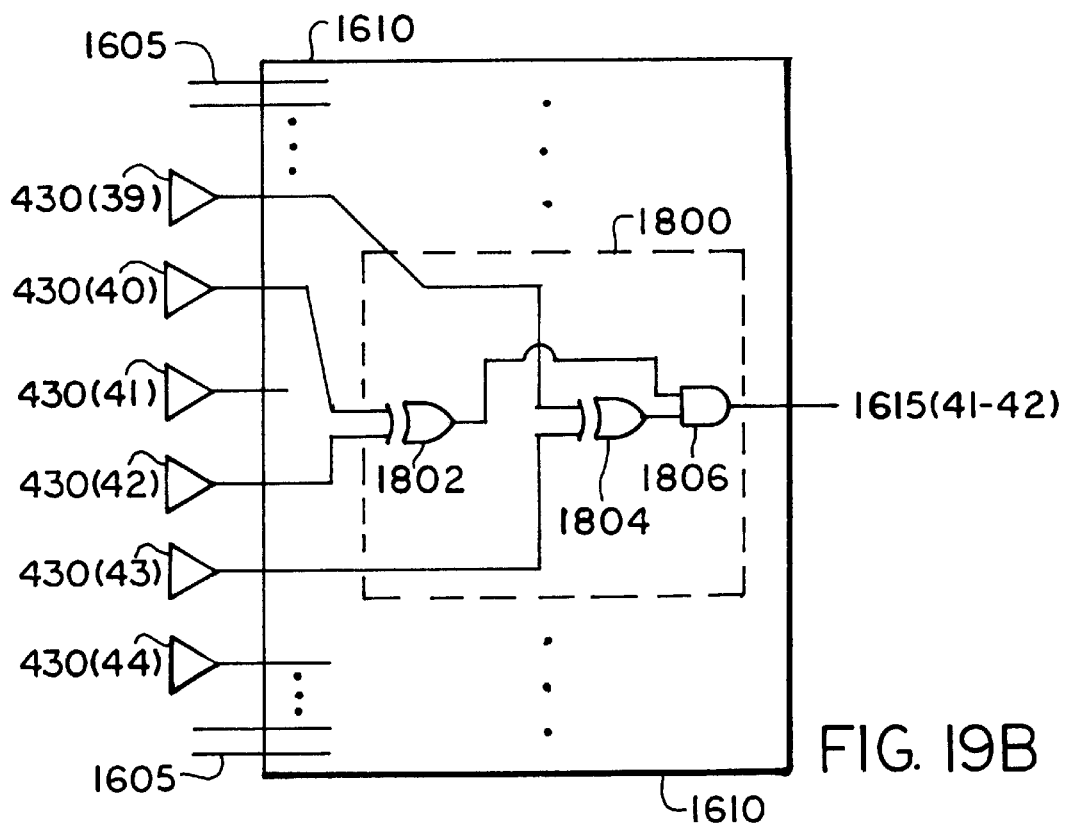
Figure 19C:
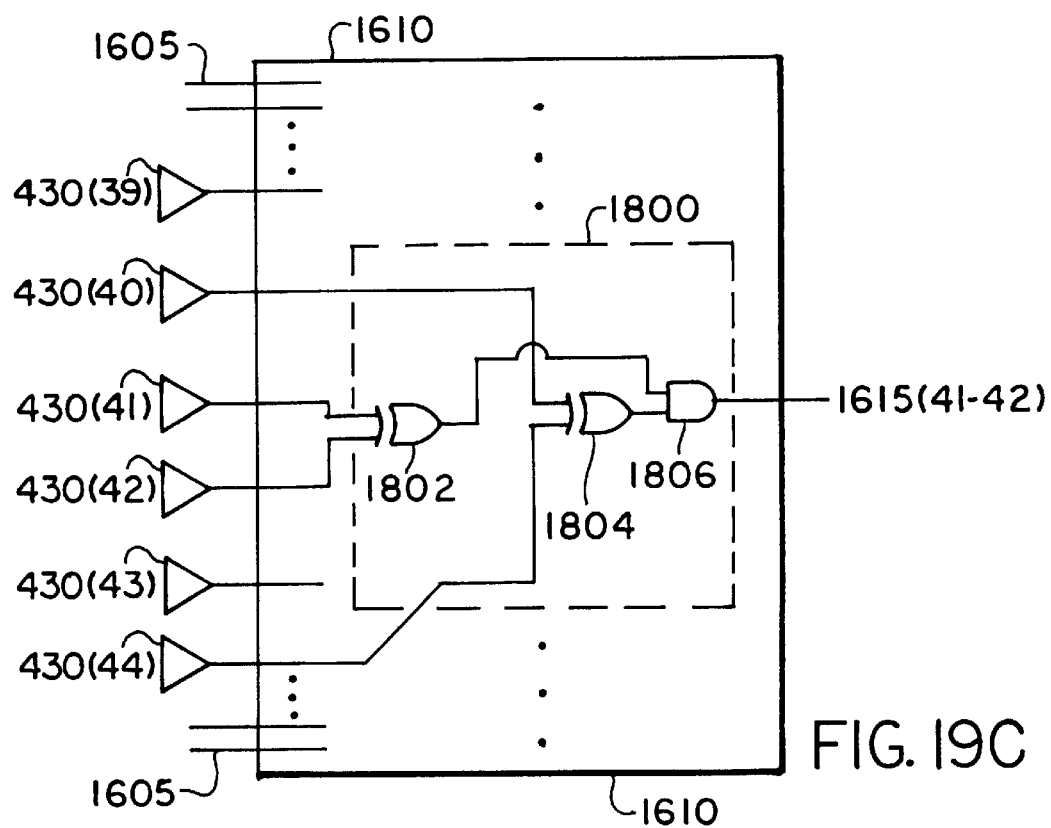

FIGS. 19A–C illustrate the adjustments made when a comparator is being calibrated. FIG. 19A demonstrates the circuit conditions when comparator 430(40) is being calibrated. In this case, the input 1605(40) which provides data from comparator 430(40) is disconnected or decoupled from the logic circuit 1800 via input line multiplexing. In place of the input 1605(40), the adjacent input 1605(39) is provided to the logic circuit 1800. Likewise, FIG. 19B demonstrates the input line adjustments for the logic circuit 1800 when the comparator 430(41) is being calibrated and FIG. 19C demonstrates the input line adjustments for the logic circuit 1800 when the comparator 430(43) is being calibrated. In each case the input lines are multiplexed so that any input line corresponding to a comparator being calibrated is decoupled from the logic circuits 1800 and the adjacent input lines are redirected so that each logic circuit 1800 still receives the four nearest adjacent inputs corresponding to comparators that are not being calibrated. Thus, calibration of a selected comparator may be accomplished even when the ADC is performing conversions. Moreover, this calibration is performed without the use of extra or proxy comparators. Thus, an ADC which under normal operations utilizes 63 comparators may be designed to allow calibration without the need for providing 64 or more comparators. Rather, when a calibration is being performed, the ADC utilizes 62 comparators for the conversion process.

As mentioned above, the comparators 430 of an ADC 320 may be individually calibrated each at separate psuedo-random times. A psuedo-random number generator may be utilized to select which one of the 63 comparators 430 is to be calibrated. The psuedo-random number may then be decoded and the calibration signals described above may be applied to the appropriate comparator. The same psuedo-random number may also be provided to the transition detection/bubble suppression circuit 1610 so that the appropriate multiplexing of the input lines may be accomplished. It will be recognized that because of the latches in the comparators (such as shown in FIGS. 6 and 9), valid data will remain at the output of a given comparator for one or more clock cycles after the calibration of that comparator begins. Thus, in order to perform the appropriate multiplexing in the transition detection/bubble suppression circuit 1610, delay latches equivalent to the latches of the comparator should be provided between the psuedo-random number generator and the transition detection/bubble suppression circuit 1610. Thus, when data from a calibration cycle of a comparator propagates through to an input 1605, the proper multiplexing occurs so as to decouple the one input line 1605 which contains data representative of a calibration cycle.

The techniques describe above may be utilized for calibrating the ADC in a data channel circuit utilized for optical data storage systems. In one example of such a system, one random comparator may be calibrated every 2000 clock cycles (at a clock rate of 120 MHz). Such a technique allows for calibration without an impact on the conversion quality except in the rare occurrences when the comparator being calibrated corresponds to the one comparator whose input reference voltage matches the analog input voltage. Moreover, even when such an event happens, because of the techniques disclosed herein the maximum impact on the conversion quality is at most a two LSB effect on the DNL. Furthermore, the technique disclosed herein does not increase the probability of "sparkle codes" (the presence of two 1 sat the output of the transition detection/bubble suppression circuit 1610 which cause an invalid output code). Thus, a technique is provided which allows for calibrating the comparators of a flash ADC even when utilized in conjunction with an optical data disk system (which may have a continuous data stream) without significantly degrading the quality of the data conversion.

The techniques described above may be utilized in a wide variety of ADC applications, particularly those utilizing flash analog to digital converters. For example, though data channel circuits for particular use with data storage systems have been described, the techniques disclosed herein may be used in other data channel circuitry. Thus, the ADC circuitry and calibration techniques may be utilized in a wide range of data communication systems, including, for example, LAN networks and other communication channels.

Furthermore, though shown herein with reference to a flash ADC utilizing multiple comparators, the concepts of the present invention may be utilized with other ADCs. For example, SAR or pipelined ADCs may utilize only one comparator yet still utilize the calibration concepts disclosed herein. In a single comparator ADC, multiple comparisons may be performed in a time division use of the comparator to achieve the desired number of bit comparisons and each comparison result may be stored or accumulated and the net of all comparisons utilized to provide the output code. Utilizing concepts disclosed herein, the single comparator may be calibrated during one of the time-division slots (preferably the LSB comparison). The output of the comparison which occurs during calibration may then be ignored (or compensated for) by the logic downstream of the comparator outputs. In this manner, conversions may be performed while calibration is also performed, with conversions performed during calibration being based upon fewer comparator output values than conversions performed when calibration is not occurring.

Further modifications and alternative embodiments of this invention will be apparent to those skilled in the art in view of this description. Accordingly, this description is to be construed as illustrative only and is for the purpose of teaching those skilled in the art the manner of carrying out the invention. It is to be understood that the forms of the invention herein shown and described are to be taken as presently preferred embodiments. Equivalent elements may be substituted for those illustrated and described herein, and certain features of the invention may be utilized independently of the use of other features, all as would be apparent to one skilled in the art after having the benefit of this description of the invention.

What is claimed is:

1. A method of calibrating an analog to digital converter, comprising:

provide a plurality of comparators, outputs of the comparators being coupled to logic circuitry, the comparators used when performing analog to digital conversions;

electrically decoupling an output of at least one of the comparators from the logic circuitry without providing a replacement output for the decoupled output;

calibrating the at least one comparator while the at least one comparator is electrically decoupled; and continuing to perform analog to digital conversions during the calibration.

2. The method of claim 1, analog to digital conversions performed during a comparison being based upon fewer comparator output values than conversions performed when a comparison is not occurring.

3. The method of claim 2, further comprising randomly or psuedo-randomly selecting the at least one comparator to be calibrated.

4. The method of claim 2 further comprising utilizing transition detection circuitry coupled to outputs of the plurality of comparators to compensate for the disconnection of the at least one comparator.

5. The method of claim 4, further comprising suppressing data bubbles with the transition detection circuitry.

6. The method of claim 2, further comprising repeating the calibrating step so that each of the plurality of comparators are calibrated.

7. A method of operating a flash analog to digital converter in a data channel circuit, comprising:

performing analog to digital conversions by utilizing a plurality of comparators;

removing at least one of the plurality of comparators from a data conversion path;

calibrating the at least one comparator when the at least one comparator is removed from the data conversion path; and continuing to perform analog to digital conversions during the calibrating step, fewer comparators being utilized for data conversions during the calibrating step than utilized during data conversions performed when calibration is not occurring.

8. The method of claim 7, further comprising repeatedly performing the calibrating step with different ones of the plurality of comparators so that each of the plurality of comparators may be calibrated without halting analog to digital conversions.

9. The method of claim 8, further comprising randomly or psuedo-randomly selecting the at least one comparator to be calibrated.

10. The method of claim 7, further comprising compensating for the removal of the at least one comparator of the plurality of comparators from a data conversion path by adjusting electrical circuitry coupled to outputs of the plurality of comparators.

11. The method of claim 10, further comprising performing bubble suppression with the electrical circuitry.

12. The method of claim 7 wherein the removal of the at least one comparator has at most a two LSB effect upon the converter DNL.

13. The method of claim 7 wherein the removal of the at least one comparator does not increase the probability of sparkle codes.

14. An analog to digital converter for performing analog to digital conversions, comprising:

a plurality of comparator circuits, each having a plurality of inputs and at least one output, together the outputs of the plurality of comparator circuits providing a transition from a first digital state to a second digital state indicative of an analog input coupled to the inputs of the plurality of comparator circuits; and an electrical circuit coupled to at least one output of each of the plurality of comparator circuits, the outputs of the comparator circuits being selectably coupled to outputs of the electrical circuit to allow calibration of at least one of the comparators while analog to digital conversions are being performed by the analog to digital converter, the electrical circuit being configured to allow the output of the at least one comparator being calibrated to be decoupled from the output of the electrical circuit.

15. The analog to digital converter of claim 14, wherein each of the plurality of comparator circuits may be coupled to at least one output of the electrical circuit during standard analog to digital conversions so that each comparator is utilized during standard analog to digital conversions, and at least one of the plurality of comparator circuits may be disconnected from an output of the electrical circuit during calibration of the at least one comparator such that fewer comparators may be utilized during analog to digital conversions performed during calibration compared to standard analog to digital conversions.

16. The converter of claim 15, the electrical circuit being a transition detection circuit.

17. The converter of claim 14, the electrical circuit being a transition detection circuit.

18. The converter of claim 17, the transition detection circuit performing bubble suppression.

19. The converter of claim 14, the electrical circuit being configured to allow calibration of each of said plurality of comparator circuits.

20. A method of operating a flash analog to digital converter comprising:

providing an analog input signal to at least a first comparator;

integrating the analog input signal as the analog input signal varies to create an integration signal;

sampling the integration signal, a sample of the integration signal representing an integration slice of the analog input signal; and calibrating at least a second comparator during at least a portion of the integrating or sampling step.

21. The method of claim 20 wherein the integration signal is the output of an integrating amplifier and the sampling step further comprises latching the output of the integrating amplifier with a latch.

22. The method of claim 20, further comprising calibrating the second comparator by correcting dynamic offsets while the second comparator is operating.

23. The method of claim 20, further comprising:

utilizing a first set of the comparators for analog to digital conversions performed when a calibration is not occurring;

utilizing a second set of the comparators during analog to digital conversions performed during the calibrating step; and utilizing fewer comparators for analog to digital conversions performed during the calibrating step than utilized during analog to digital conversions performed when a calibration is not occurring.

24. The method of claim 23, further comprising calibrating the second comparator by correcting dynamic offsets while the second comparator is operating.

25. An analog to digital converter circuit comprising:

a plurality of comparator circuits, each comparator circuit comprising, a differential integrating amplifier having at least two amplifier inputs, a plurality of reference voltage inputs, a plurality of comparator voltage inputs, a plurality of reference voltage storage elements switchably coupled to both the reference voltage inputs and the comparator voltage inputs by a set of first switches, at least one storage element coupled to each amplifier input, and a reset switch coupled between outputs of the integrating amplifier for resetting the amplifier differential output voltage, the reset switch and first switches being operable to couple the comparator voltage inputs to the integrating amplifier inputs when the integrating amplifier is free to integrate; and an electrical circuit coupled to at least one output of each comparator circuit, the electrical circuit configured so that the output of at least one comparator circuit may be disconnected from a data conversion path to allow calibration of the at least one comparator circuit while the analog to digital converter is performing data conversions.

26. The converter of claim 25, further comprising a latch coupled to the outputs of the integrating amplifier and a latch switch for resetting the latch.

27. The converter of claim 25, further comprising offset control circuitry coupled to at least one comparator circuit to provide a comparator control loop, the offset control circuitry calibrating offsets of the comparator while the comparator is operating.

28. The converter of claim 25, the electrical circuit being a transition detection circuit capable of performing bubble suppression.

29. The converter of claim 28, further comprising offset control circuitry coupled to at least one comparator circuit to provide a comparator control loop, the offset control circuitry calibrating offsets of the comparator while the comparator is operating.

30. A method of calibrating a comparator of an ADC circuit, comprising:
   providing an ADC circuit having at least one comparator circuit;
   operating the comparator; and
   calibrating the comparator by correcting dynamic offsets while the comparator is operating and while the ADC circuit is performing analog to digital conversions.

31. The method of claim 30, further comprising
   compensating for static offsets by performing an auto-zero operation; and
   operating the comparator during calibration at operating clock speeds to determine a dynamic offset.

32. The method of claim 30, further comprising performing the analog to digital conversions by generating an integration slice of an analog input signal.

33. The method of claim 30, further comprising:
   utilizing a first set of comparator outputs for analog to digital conversions performed when a calibration is not occurring;
   utilizing a second set of comparator outputs during analog to digital conversions performed during the calibrating step; and
   utilizing fewer comparator outputs for analog to digital conversions performed during the calibrating step than utilized during analog to digital conversions performed when a calibration is not occurring.

34. The method of claim 30, further comprising performing the analog to digital conversions by generating an integration slice of an analog input signal.

35. An analog to digital converter, comprising:
   a plurality of comparators, each having an input coupled to an ADC input;
   a plurality of comparator outputs;
   an amplifier coupled to at least one comparator input and at least one comparator output;
   offset control circuitry, the offset control circuitry providing a comparator control loop, the offset control circuitry calibrating dynamic offsets of the at least one comparator while the at least one comparator is operating; and
   an electrical circuit coupled to the plurality of comparator outputs, the electrical circuit configured so that the output of the at least one comparator circuit being calibrated may be disconnected from a data conversion path to allow calibration of the at least one comparator circuit while the analog to digital converter is performing data conversions.

36. The converter of claim 35, the offset control circuitry comprising at least one capacitor switchably coupled to the control node for adjusting the voltage at the control node in response to the offset voltage detected.

37. The converter of claim 36, further comprising:
   a plurality of reference voltage storage elements switchably coupled to both reference voltage inputs and comparator voltage inputs by a set of first switches, at least one storage element coupled to each amplifier input; and
   a reset switch coupled between outputs of the amplifier for resetting an amplifier differential output voltage, the reset switch and first switches being operable to couple the comparator voltage inputs to the amplifier inputs when the amplifier is free to integrate.

38. The method of claim 35, further comprising:
   utilizing a first set of the comparators for analog to digital conversions performed when a calibration is not occurring;
   utilizing a second set of the comparators during analog to digital conversions performed during the calibrating step; and
   utilizing fewer comparators for analog to digital conversions performed during the calibrating step than utilized during analog to digital conversions performed when a calibration is not occurring.

39. A data storage system comprising:
   a data input coupled to a data storage medium, the input receiving a data stream from the data storage medium;
   an analog to digital converter coupled to the input;
   a plurality of comparators within the analog to digital converter;
   an electrical circuit coupled to a plurality of comparator outputs, the electrical circuit configured so that the output of at least one comparator circuit being calibrated may be disconnected from a data conversion path to allow calibration of the at
   least one comparator circuit while the analog to digital converter is performing data conversions.

40. The system of claim 39, wherein
   each of the plurality of comparator circuits may be coupled to at least one output of the electrical circuit during standard analog to digital conversions so that each comparator is utilized during standard analog to digital conversions, and
   at least one of the plurality of comparator circuits may be disconnected from an output of the electrical circuit during calibration of the at least one comparator such that fewer comparators may be utilized during analog to digital conversions performed during calibration compared to standard analog to digital conversions.

41. The system of claim 40, the electrical circuit capable of performing bubble suppression.

42. The system of claim 40, the data storage medium being an optical disk medium.

43. A method of operating a data channel system comprising:
   receiving an input data signal;
   coupling the input data signal to a sampling circuit, the sampling circuit including a plurality of comparators;
   utilizing the plurality of comparators when performing analog to digital conversions;

removing at least one of the plurality of comparators from a data conversion path;

calibrating the at least one comparator when the at least one comparator is removed from the data conversion path; and continuing to perform analog to digital conversions during the calibrating step, fewer comparators being utilized during the calibrating step for data conversions than utilized during the performing step.

44. The method of claim 43, further comprising randomly or psuedo-randomly selecting the at least one comparator to be calibrated.

45. The method of claim 43, further comprising utilizing bubble suppression circuitry to compensate for the removal of the at least one comparator.

46. The method of claim 45, wherein the utilizing bubble suppression circuitry step does not increase the probability of sparkle codes.

47. The method of claim 43, further comprising intermittently calibrating at least one of the comparators, at least a portion of the calibration being performed while said at least one comparator is being clocked.

48. The method of claim 47, wherein said calibrating step calibrates dynamic offsets of the comparator.

49. The method of claim 43, the data channel system being an optical data storage system.

50. A method of calibrating an analog to digital converter, comprising:

providing a plurality of comparators;

utilizing a first set of the comparators for analog to digital conversions performed when a calibration is not occurring;

calibrating at least one of the comparators while analog to digital conversions are being performed;

utilizing a second set of the comparators during analog to digital conversions performed during the calibrating step; and utilizing fewer comparators for analog to digital conversions performed during the calibrating step than utilized during analog to digital conversions performed when a calibration is not occurring.

51. The method of claim 50, further comprising:

disconnecting from a data conversion path the at least one comparator being calibrated, the first set of comparators comprising the at least one disconnected comparator and the second set of comparators.

52. The method of claim 51, further comprising randomly or psuedo-randomly selecting the at least one comparator to be calibrated.

53. A method of calibrating an analog to digital converter, comprising:

generating a plurality of comparator output values from at least one comparator;

providing the comparator output values to electrical circuitry to calculate a digital value based upon the plurality of comparator output values;

calibrating the at least one comparator; and decoupling from at least a portion of the electrical circuitry the comparator output value generated by the at least one comparator being calibrated without providing a replacement comparator output value for the decoupled comparator output value.

54. Method of claim 53, further comprising providing multiple comparator output values from the at least one comparator for a single conversion.

55. The method of claim 53, all of the comparator output values being provided from a single comparator.

56. The method of claim 53, wherein the analog to digital converter is a flash analog to digital converter having a plurality of comparators.

57. An analog to digital converter comprising:

at least one comparator, the at least one comparator having an output coupled to a circuit to determine a digital value based upon data at the output;

decoupling circuitry coupled to the output, the decoupling circuitry allowing the output of the at least one comparator to be decoupled from at least a portion of the circuit, the decoupling circuitry allowing calibration of the at least one comparator during conversion without the use of a replacement comparator.

58. The analog to digital converter of claim 57, the converter having a plurality of comparators.

59. The analog to digital converter of claim 58, the analog to digital converter being a flash analog to digital converter.

60. The analog to digital converter of claim 59, the circuit being a transition detection circuit.

61. The analog to digital converter of claim 57, the comparator providing multiple output values for each conversion.

* * * * *